(12) United States Patent
Tsujimura et al.

(10) Patent No.: US 6,614,059 B1
(45) Date of Patent: Sep. 2, 2003

(54) SEMICONDUCTOR LIGHT-EMITTING DEVICE WITH QUANTUM WELL

(75) Inventors: Ayumu Tsujimura, Osaka (JP); Yoshiaki Hasegawa, Osaka (JP); Akihiko Ishibashi, Osaka (JP); Isao Kidoguchi, Hyogo (JP); Yuzaburo Ban, Osaka (JP); Masakatsu Suzuki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/479,244

(22) Filed: Jan. 7, 2000

(30) Foreign Application Priority Data

Jan. 7, 1999 (JP) ............................................. 11-001940

(51) Int. Cl.$^7$ ............................................. H01L 33/00
(52) U.S. Cl. ........................ 257/101; 257/102; 257/103
(58) Field of Search .............................. 257/13, 14, 17, 257/18, 22, 94, 96, 101–103; 372/43, 45–46

(56) References Cited

U.S. PATENT DOCUMENTS 5,740,192 A * 4/1998 Hatano et al. ............... 257/101

FOREIGN PATENT DOCUMENTS

| JP | 6196757 | 7/1994 |
|---|---|---|
| JP | 09-116225 | 5/1997 |
| JP | 10-065271 | 3/1998 |
| JP | 10-173232 | 6/1998 |
| JP | 10-242585 | 9/1998 |
| JP | 10-321965 | 12/1998 |
| JP | 11340580 A | * 10/1999 |
| JP | 11-340580 | 12/1999 |

OTHER PUBLICATIONS

S. Nakamura, et al., "Room–temperature continuous–wave operation of InGaN multi–quantum–well structure laser diodes with a lifetime of 27 hours", Applied Physics Letters, vol. 70, No. 11, pp. 1417–1419, Mar. 17, 1997.*

Notice of Reasons of Rejection with English Translation, Patent Application No: 11–373224, Mailing No. 166204, Mailing Date: May 28, 2002.

Nakamura et al., "InGaN–Based Multi–Quantum–Well–Structure Laser Diodes", pp. L74–L76, Jan. 15, 1996, Jpn. J. Appl. Phys. vol. 35, part 2, 1B.

Nakamura et al., "InGaN Multi–Quantum–Well–Structure Laser Diodes with Cleaved Mirror Cavity Facets", pp. L217–L220, Feb. 15, 1996, Jpn. J. Appl. Phys. vol. 35, part 2, 2B.

Notice of Reasons of Rejection, Patent Application No: 11–373224, Mailing No. 056983, Mailing Date: Feb. 26, 2002.

Shuji Nakamura et al., "*InGaN/GaN/AlGaN–Based Laser Diodes with Modulation–Doped Strained–Layer Superlattices,*" Jpn. J. Appl. Phys., vol. 36 (1997), part 2 No. 12A, pp. L1568–L1571, Dec. 1, 1997.

Y. Chen et al. "Pit Formation in GaLnN quantum wells," Applied Physics Letters, vol. 72, No. 6, pp. 710–712, Feb. 9, 1998.

* cited by examiner

*Primary Examiner*—Minh Loan Tran
*Assistant Examiner*—Thomas L. Dickey
(74) *Attorney, Agent, or Firm*—McDermott, Will & Emery

(57) ABSTRACT

A semiconductor light-emitting device of Group III-V compound semiconductors includes a quantum well layer, which is formed over a substrate and includes a barrier layer and a well layer that are alternately stacked one upon the other. The band gap of the well layer is narrower than that of the barrier layer. The well layer contains indium and nitrogen, while the barrier layer contains aluminum and nitrogen. In this structure, a tensile strain is induced in the barrier layer, and therefore, a compressive strain induced in the quantum well layer can be reduced. As a result, a critical thickness, at which pits are created, can be increased.

5 Claims, 15 Drawing Sheets

SEMICONDUCTOR LIGHT-EMITTING DEVICE WITH QUANTUM WELL

BACKGROUND OF THE INVENTION

The present invention relates to a light-emitting device like a semiconductor laser device, and more particularly relates to a semiconductor light-emitting device for emitting radiation in the ultraviolet to blue regions. The present invention also relates to a method for fabricating the semiconductor light-emitting device and to an optical disk apparatus using the light-emitting device.

In recent years, semiconductor light-emitting devices that can emit radiation at short wavelengths ranging from the ultraviolet to blue regions, or semiconductor laser devices, in particular, have been researched and developed vigorously. This is because such light-emitting devices are expected to further increase the recording density of optical disks or the resolution of laser printers and are applicable to optical measuring instruments, medical equipment, display devices, illuminators and so on.

Examples of semiconductor materials that can emit radiation at such short wavelengths include Group III nitride semiconductors. For instance, a semiconductor laser device with a multiple quantum well active layer, which is a stack of silicon (Si)-doped GaInN/GaInN layers, can oscillate continuously at a wavelength of about 401 nm and at room temperature and can operate for as long as about 3,000 hours under the conditions that the ambient temperature is 20° C. and the output power thereof is 2 mW. See Japanese Journal of Applied Physics, Vol. 36 (1997), pp. 1568–1571, for example.

Group III nitride semiconductor crystals are generally grown by a metalorganic vapor phase epitaxy (MOVPE) process. For example, Japanese Laid-Open Publication No. 6-196757 discloses a method of growing a semiconductor layer of GaInN of excellent crystal quality on a semiconductor layer of GaN by using nitrogen as a carrier gas.

The known method of producing a Group III nitride semiconductor, however, is disadvantageous in that pits are created in the GaInN/GaN multiple quantum well structure thereof (to be an active layer) at as high a density as $10^8$ to $10^9$ cm$^{-2}$ as described in Applied Physics Letters, Vol. 72 (1998), pp. 710–712, for example.

Those pits adversely affect the operation characteristics of a light-emitting device, e.g., raises the threshold value, at which the laser device starts to oscillate, or lowers the reliability thereof. This is because the existence of the pits not only decreases the luminous efficacy, but also causes localized levels by making the composition of In nonuniform, constitutes a source of diffusion of In being grown or results in scattering or absorption loss in an optical waveguide.

To obtain a Group III nitride semiconductor light-emitting device, or semiconductor laser device, in particular, with characteristics practically applicable to an optical disk apparatus, for example, the composition of In within the GaInN well layer thereof should be uniformized. In addition, each multiple quantum well layer should be of uniform quality and be sufficiently planarized.

Moreover, the structure of the device should be modified such that electrons, which are injected from an n-type conductive layer into the quantum well layer, can be injected into the active layer efficiently and uniformly without overflowing into a p-type conductive layer during the operation of the device.

SUMMARY OF THE INVENTION

An object of the present invention is solving the problems of the prior art to suppress the creation of pits in quantum well layer containing indium and nitrogen in a Group III nitride semiconductor light-emitting device and to inject electrons into the quantum well layer more efficiently.

To achieve this object, the present invention takes the following measures:

1) Each barrier layer included in the quantum well layer contains aluminum;
2) The stress vector of each barrier layer is of the opposite sign to that of each well layer;
3) Only one of barrier layers that is in contact with a p-type conductive layer contains aluminum in multiple quantum well layer;
4) In growing the quantum well layer by an MOVPE process, triethylgallium is used as a gallium source.

The present inventors analyzed how inverted hexagonal parallelepiped pits with {1-101} planes as facets are formed at a high density in a GaInN/GaN or GaInN/GaInN multiple quantum well structure in accordance with a conventional fabrication process. As a result, we reached the following conclusions.

To relax a compressive strain induced in a GaInN layer or a strain resulting from localized segregation of In, nuclei of pits are created at more than a critical thickness. In addition, at the growth temperature of the GaInN layer (usually at a growth temperature of about 800° C.), the growth rate for {1-101} planes is lower than that for the (0001) plane in the GaInN layer. Accordingly, as the crystals are growing, the pits are also increasing their sizes. Those pits, which have been created in the GaInN layer, are gradually filled in and the surfaces of the crystals are planarized while an optical guide layer, a cladding layer and so on are grown one upon the other on the GaInN layer at a growth temperature of about 1000° C. This is because the growth rate for the {1-101} planes is higher than that for the (0001) plane in the optical guide layer, etc.

It should be noted that when a zone axis index or a Miller index representing a crystallographic plane orientation is followed by a negative sign, the index following the negative sign is a negative direction index in this specification.

The present inventors examined various methods of suppressing the creation of those pits. As a result, we made the following findings.

Specifically, if the multiple quantum well structure includes an aluminum (Al)-containing barrier layer, then a tensile strain is induced in the barrier layer, and a compressive strain applied to the multiple quantum well structure decreases. Consequently, the critical thickness increases.

In addition, the existence of Al with high electric field intensity in a crystal reduces the diffusion of In, thus suppressing the segregation of In, which strongly tends to segregate locally.

Moreover, the growth rate of the Al-containing semiconductor layer, i.e., an AlGaN layer, for the {1-101} planes is not so different from that for the (0001) plane compared to the GaInN layer. Accordingly, the expansion of pits can be reduced.

Furthermore, if the In mole fraction in the well layer is 0.1 or less, the total thickness of the multiple quantum well structure does not exceed the critical thickness.

Furthermore, if the strain vector of the barrier layer is of the sign opposite to that of well layer, then the total strain applied to the multiple quantum well structure can be reduced, thus increasing the critical thickness.

Also, if triethylgallium (TEG) is used a gallium source in forming the multiple quantum well structure, then the growth rate for the (0001) plane is not so different from that for the {1-101} planes in the quantum well structure.

Accordingly, the expansion of pits can be reduced.

As for a method for injecting electrons more efficiently, we made the following findings.

If the multiple quantum well structure includes a barrier layer with a strain vector of the opposite sign to that of each well layer, then the total strain induced in the multiple quantum well structure can be smaller. Thus, the intensity of a piezoelectric field induced in the multiple quantum well structure decreases. As a result, electrons are injected into the well layers more uniformly.

Alternatively, if only one barrier layer in contact with a p-type conductive layer contains Al and the other barrier layers, which are not in contact with the p-type conductive layer, do not contain Al, then the electrons injected into the well layers do not overflow into the p-type conductive layer. As a result, the electrons can be injected into the well layers more efficiently.

Specifically, a first semiconductor light-emitting device according to the present invention is made of Group III-V compound semiconductors. The device includes a quantum well layer, which is formed over a substrate and includes a barrier layer and a well layer that are alternately stacked one upon the other. The band gap of the well layer is narrower than that of the barrier layer. And the well layer contains In and N, while the barrier layer contains Al and N.

In the first semiconductor light-emitting device, the barrier layer contains Al and N. That is to say, if Al is contained in the barrier layer, a tensile strain is induced in the barrier layer to fill in the pits, which are created at more than the critical thickness to relax the compressive strain induced in the well layer. As a result, the compressive strain induced in the quantum well layer decreases and the critical thickness increases. Also, since Al is contained in the barrier layer, the In segregation in the well layer can be suppressed. Moreover, the growth rate for the {1-101} planes is not so different from that for the (0001) plane compared to a well layer containing In. Accordingly, the expansion of pits can be suppressed, thus reducing the threshold current of the light-emitting device and greatly improving the reliability of the device.

In the first semiconductor light-emitting device, a plurality of the barrier layers are preferably provided between p- and n-type conductive layers. One of the barrier layers that is in contact with the p-type conductive layer preferably has an aluminum mole fraction larger than that of the other barrier layer(s) that is/are not in contact with the p-type conductive layer. In such an embodiment, since Al is added to the barrier layer in contact with the p-type conductive layer, the barrier layer has its heterobarrier increased. Thus, it is possible to prevent electrons, which have been externally injected, from overflowing into the p-type conductive layer without being injected into the well layers. As a result, the electrons can be injected into the well layers more efficiently.

In this particular embodiment, the aluminum mole fraction of the one barrier layer in contact with the p-type conductive layer preferably increases from a part thereof closest to the n-type conductive layer toward another part thereof closest to the p-type conductive layer. In such an embodiment, the hole density in the barrier layer in contact with the p-type conductive layer can be decreased, thus increasing the efficiency with which holes are injected into the well layers.

In the first semiconductor light-emitting device, the well layer is preferably made of gallium indium nitride (GaInN) or aluminum gallium indium nitride (AlGaInN), while the barrier layer is preferably made of aluminum gallium nitride (AlGaN). In such an embodiment, the creation of the pits can be suppressed with much more certainty in the quantum well layer.

A second semiconductor light-emitting device according to the present invention is made of Group III-V compound semiconductors. The device includes a quantum well layer, which is formed over a substrate and includes a barrier layer and a well layer that are alternately stacked one upon the other. The band gap of the well layer is narrower than that of the barrier layer. The barrier layer has a strain vector of a sign opposite to that of a strain vector of the well layer.

In the second semiconductor light-emitting device, since the strain vectors of the barrier and well layers are of mutually opposite signs, the strain quantities in the quantum well structure are canceled by each other and decrease. Accordingly, the critical thickness, at which pits are created, increases and in addition, the piezoelectric field induced in the quantum well structure decreases. As a result, electrons and holes are injected into each well layer uniformly, thus increasing the luminous efficacy.

In the second semiconductor light-emitting device, the well layer preferably contains In and the barrier layer preferably contains Al.

The first or second semiconductor light-emitting device preferably further includes first and second optical guide layers. The first optical guide layer is provided on one side of the quantum well layer that is closer to the substrate, while the second optical guide layer is provided on another side of the quantum well layer that is opposite to the substrate. The band gap of the barrier layer is preferably smaller than or equal to that of the first and second optical guide layers.

Also, an In mole fraction of the well layer is preferably larger than 0 and equal to or smaller than 0.1. In such an embodiment, it is possible to prevent the total thickness of the quantum well layer from exceeding the critical thickness. As a result, the creation of the pits can be suppressed with much more certainty in the quantum well layer.

Moreover, the barrier layer or the well layer preferably contains silicon (Si) as a dopant. In such an embodiment, it is possible to prevent In from locally segregating in the quantum well layer, thus relaxing the strain resulting from such local segregation of In. As a result, the creation of the pits, which are formed to reduce the strain, can be suppressed.

A third semiconductor light-emitting device according to the present invention is made of Group III-V compound nitride semiconductors. The device includes: a quantum well layer, which is formed over a substrate and includes a plurality of barrier layers and a well layer that are alternately stacked one upon the other, the band gap of the well layer being narrower than that of each said barrier layer; and p- and n-type conductive layers formed over the substrate to vertically interpose the quantum well layer therebetween. One of the barrier layers that is in contact with the p-type conductive layer contains aluminum, while the other barrier layer(s) that is/are not in contact with the p-type conductive layer contain(s) no aluminum.

In the third semiconductor light-emitting device, a large heterobarrier, which is caused by the addition of Al, exists between the barrier layer in contact with the p-type conductive layer and the well layer in contact with the barrier layer on the opposite side to the p-type conductive layer. Thus, it is possible to prevent electrons from going over the well layer to overflow into the p-type conductive layer. In addition, since a piezoelectric field is induced in the direction in which the overflow of the electrons over the well layer is suppressed, the electrons can be injected into the well layer more efficiently.

In the third semiconductor light-emitting device, the well layer preferably contains In.

In the third semiconductor light-emitting device, the well layer is preferably made of GaInN, the barrier layer in contact with the p-type conductive layer is preferably made of AlGaN, and the other barrier layer(s) is/are preferably made of GaInN or GaN.

An inventive method for fabricating a semiconductor light-emitting device is adapted to fabricate a semiconductor light-emitting device of Group III-V compound semiconductors, in which a quantum well layer including barrier and well layers is formed by a metalorganic vapor phase epitaxy process over a substrate by alternately stacking the barrier and well layers one upon the other. The band gap of the well layer is narrower than that of the barrier layer. The method includes the steps of: forming the barrier layer, which contains gallium (Ga) and nitrogen (N), over the substrate by using at least gallium and nitrogen sources as first source materials; and forming the well layer, which contains Ga, In and N, on the barrier layer by using at least gallium, indium and nitrogen sources as second source materials. The gallium source used in the steps of forming the barrier layer and the well layer is triethylgallium (TEG).

According to the inventive method for fabricating a semiconductor light-emitting device, TEG is used as the gallium source in the steps of forming the barrier layer and the well layer. Thus, the growth rate of the quantum well layer for the {1-101} planes is not so different from that for the (0001) plane. Accordingly, the expansion of pits can be suppressed, thus improving the crystal quality of the well layers. As a result, the operating performance of the device can be improved.

In the inventive method for fabricating a semiconductor light-emitting device, the step of forming the barrier layer preferably includes the step of forming the barrier layer of AlGaN by using an aluminum source as an additional one of the first source materials. The step of forming the well layer preferably includes the step of forming the well layer of either GaInN or AlGaInN by using an aluminum source as an additional one of the second source materials. Also, an In mole fraction of the well layer is preferably larger than 0 and equal to or smaller than 0.1.

An optical disk apparatus according to the present invention includes: the semiconductor light-emitting device according to any of the first through aspects of the present invention; a condensing optical system for condensing outgoing radiation, which has been emitted from the semiconductor light-emitting device, on a storage medium on which data has been recorded; and a photodetector for receiving light that has been reflected from the storage medium.

In the inventive optical disk apparatus, the photodetector preferably reads the data that has been recorded on the storage medium based on a reflected part of the outgoing radiation.

In this case, the photodetector is preferably provided near the semiconductor light-emitting device.

In this particular embodiment, the photodetector is preferably provided on a principal surface of a support member made of silicon, and the semiconductor light-emitting device is preferably supported on the principal surface of the support member.

In such a case, the principal surface of the support member is preferably provided with a concave portion with a micro mirror on a sidewall thereof. And the semiconductor light-emitting device is preferably secured to the bottom of the concave portion of the support member such that the outgoing radiation emitted from the semiconductor light-emitting device is reflected from the micro mirror and advances substantially vertically to the principal surface of the support member.

DESCRIPTION OF THE PREFERRED EMBODIMENTS

Embodiment 1

Hereinafter, a first embodiment of the present invention will be described with reference to the accompanying drawings.

Figure 1:
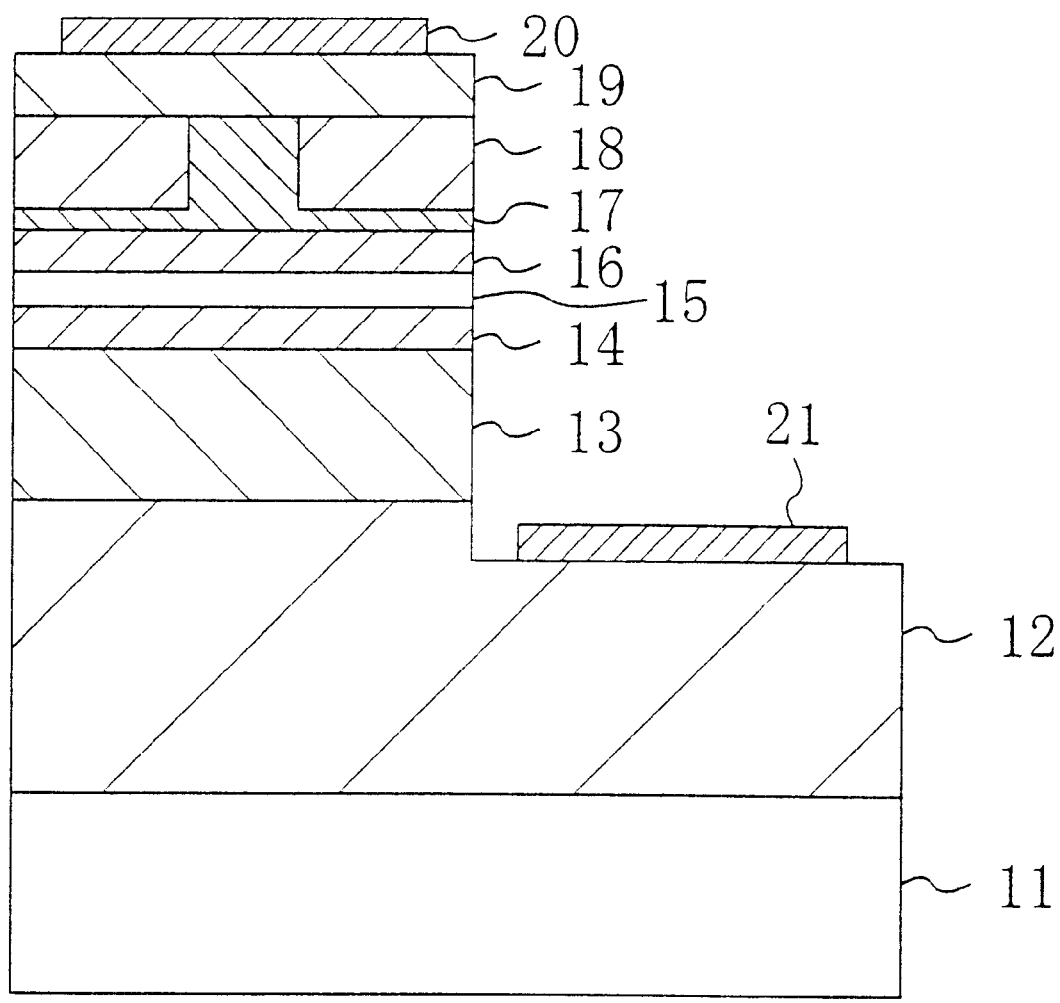
FIG. 1 is a cross-sectional view illustrating a schematic structure of a semiconductor light-emitting device according to a first embodiment of the present invention.

FIG. 1 illustrates a schematic cross-sectional structure of a semiconductor light-emitting device according to the first embodiment of the present invention. On a GaN substrate 11 with a (0001) plane as its principal surface, for example, a buffer layer 12 of n-type GaN, of which the upper surface is partially exposed; a cladding layer 13 of n-type AlGaN for creating a potential barrier for a multiple quantum well active layer (to be described below) and thereby confining n-type carriers therein; an optical guide layer 14 of n-type AlGaN for confining the radiation created therein; a multiple quantum well active layer 15, which is formed by alternately stacking GaInN well layers and AlGaN barrier layers one upon the other and in which n- and p-type carriers are recombined with each other to emit radiation therefrom; an optical guide layer 16 of p-type AlGaN for confining the radiation produced therein; a cladding layer 17 of p-type AlGaN for creating a potential barrier for the multiple quantum well active layer 15 and thereby confining p-type carriers therein; a current blocking layer 18 of n-type GaN for injecting current into the multiple quantum well active layer 15 efficiently; and a contact layer 19 of p-type GaN for making ohmic contact with a p-side electrode 20 are formed in this order.

The p-side electrode 20 of Ni/Au is formed on the upper surface of the contact layer 19. On the exposed part of the buffer layer 12, formed is an n-side electrode 21 of Ti/Al.

In this case, materials for the substrate 11 are not limited to gallium nitride (GaN), but include sapphire ($Al_2O_3$), silicon carbide (SiC), silicon (Si), spinel, zinc sulfide (ZnS), zinc oxide (ZnO) and gallium arsenide (GaAs), for example. If the substrate 11 is made of a material other than GaN, however, another buffer layer of GaN, for example, should be deposited at a low temperature between the substrate 11 and the buffer layer 12 to obtain quality GaN semiconductor crystals by buffering a lattice misfit between the substrate 11 and the crystals, because the substrate 11 and the GaN semiconductor crystals are of dissimilar materials.

The plane orientation of the substrate 11 does not have to be such a plane with a low index. Alternatively, the zone axis thereof may be inclined in a predetermined direction. For example, where the substrate is made of GaN, the zone axis of the substrate may be inclined by 2 degrees in the [11-20] direction about a (0001) plane of GaN. The conductivity type of the substrate 11 may be either n-type or p-type or even an insulating substrate may also be used.

By forming the GaN buffer layer 12 on the GaN substrate 11, respective semiconductor layers, which will constitute a quality Group III nitride semiconductor laser structure, can be grown according to this embodiment. GaN is selected for the buffer layer 12 because crystals of quality can be obtained more easily than any other Group III nitride semiconductor. The thickness of the buffer layer 12 has only to be about 100 nm or more. When the substrate 11 is not made of a material with low resistance as is done in this embodiment, the p- and n-side electrodes 20 and 21 both need to be formed on the circuitry side of the substrate 11. Thus, the thickness herein should be at least about 1000 nm or more.

The n- and p-type cladding layers 13 and 17 of AlGaN both have an Al mole fraction (composition) of 0.09. The thicknesses of the n- and p-type cladding layers 13 and 17 are preferably about 900 nm and about 600 nm, respectively. A tensile strain is applied to AlGaN. Accordingly, as the Al mole fraction or the thicknesses of these cladding layers 13 and 17 increase, cracking is more and more likely to be caused during the crystal growth thereof. Thus, to avoid such cracking, a strained superlattice structure is preferably formed by alternately stacking $Al_{0.18}Ga_{0.82}N$ layers (thickness: about 3 nm) of a first group and GaN layers (thickness: about 3 nm) of a second group one upon the other. Also, a so-called "modulated doping" may be adopted in such a case. That is to say, the first group of layers may be doped with an n- or p-type dopant while the second group of layers may be non-doped. Moreover, by using AlGaInN quaternary crystals, a laser structure that lattice-matches with the GaN substrate 11 can be formed. As a result, not only cracking but also dislocations can be suppressed.

The n- and p-type optical guide layers 14 and 16 of AlGaN both have an Al mole fraction of 0.02 and a thickness of about 100 nm, for example. The light confinement function of a laser structure is also determined by the specifications (such as thicknesses and refractive indices) of the multiple quantum well active layer 15 and the n- and p-type cladding layers 13 and 17. Thus, as the case may be, the optical guide layers 14 and 16 may be made of GaN not containing Al.

Figure 2:
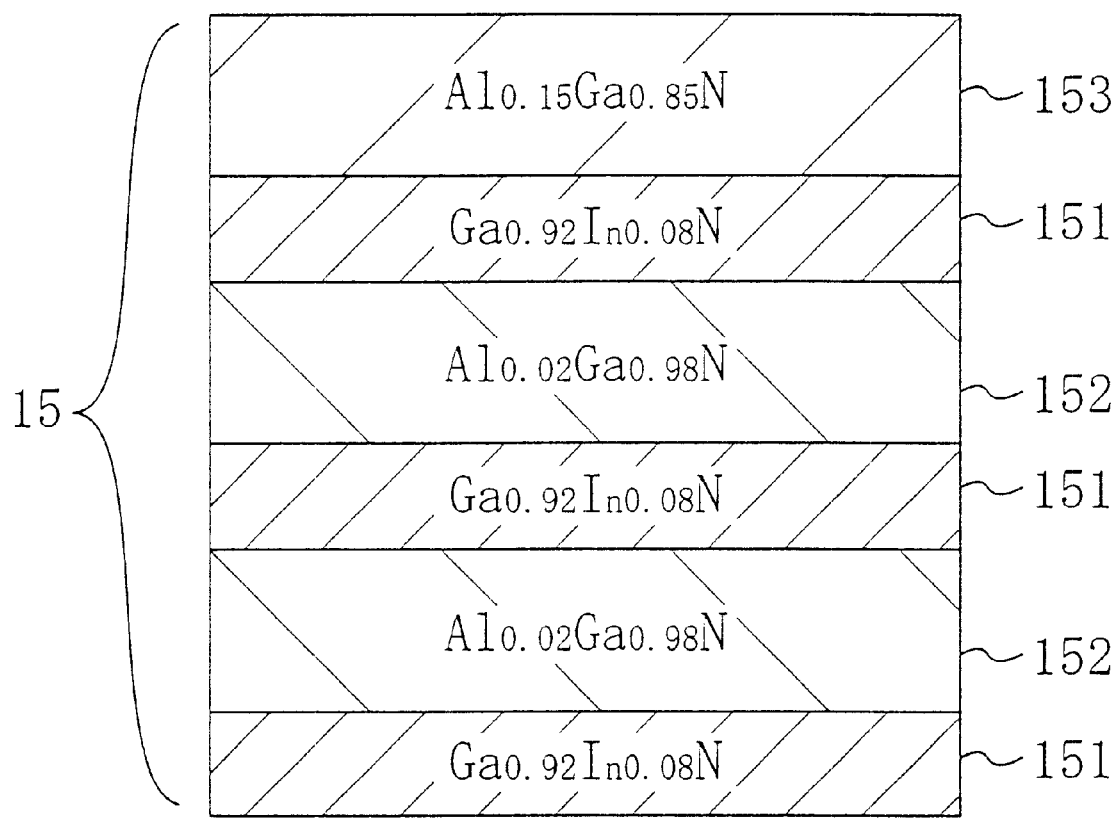
FIG. 2 is a cross-sectional view illustrating a detailed structure of a multiple quantum well active layer in the semiconductor light-emitting device according to the first embodiment of the present invention.

Hereinafter, the multiple quantum well active layer characteristic of the first embodiment will be described with reference to the accompanying drawings. FIG. 2 illustrates a detailed cross-sectional structure of the multiple quantum well active layer 15 according to the first embodiment. As shown in FIG. 2, the multiple quantum well active layer 15 according to this embodiment includes: three GaInN well layers 151, each of which is about 3 nm thick and has an In mole fraction of 0.08; two AlGaN barrier layers 152, each of which is formed between an associated pair of well layers 151, is about 5 nm thick and has an Al mole fraction of 0.02; and one protective layer 153, which is formed on the upper surface of the third well layer 151, is about 5 nm thick and has an Al mole fraction of 0.15. In this case, the protective layer 153 is provided to prevent In from being desorbed again from the GaInN crystals in the uppermost well layer 151 into the gas after the well layers 151 and barrier layers 152 have been grown. The protective layer 153 is also provided to inject electrons into the active layer efficiently during the operation of the light-emitting device. The protective layer 153 is preferably doped with a p-type dopant.

The oscillation wavelength of the laser radiation is controllable, or shortened or lengthened, depending on the In mole fraction in each well layer 151. To keep the quality of crystals high, however, the In mole fraction should be larger than zero and equal to or smaller than 0.3. Preferably, the In mole fraction should be larger than zero and equal to or smaller than 0.2 to prevent the In composition from getting non-uniform and to reduce the threshold current of oscillation in the multiple quantum well active layer 15. More preferably, the In mole fraction should be larger than zero and equal to or smaller than 0.1 to suppress the creation of pits during the crystal growth. Also, the well and barrier layers 151 and 152 are preferably doped with Si as a dopant.

Figure 3:
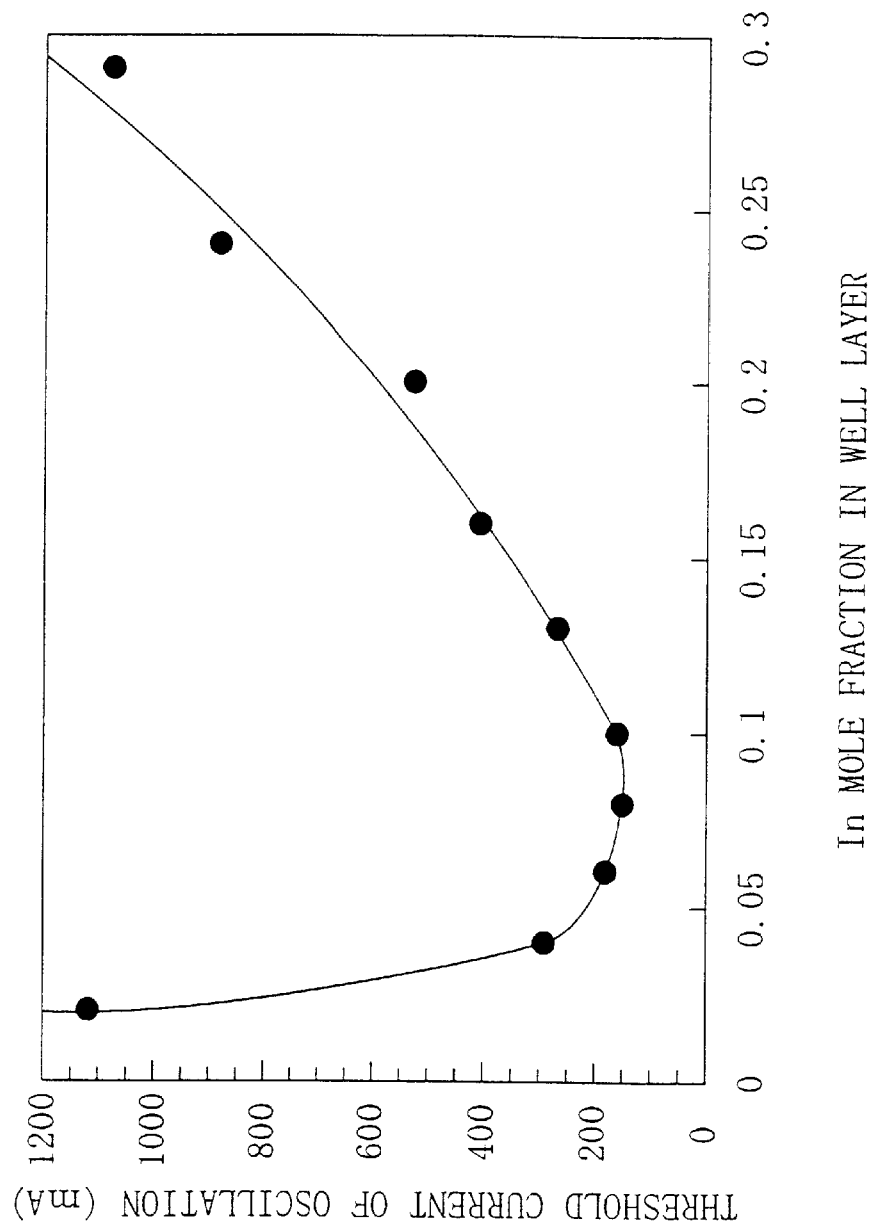
FIG. 3 is a graph illustrating a relationship between the In mole fraction in the well layers and the oscillation threshold current in the semiconductor light-emitting device according to the first embodiment of the present invention.

FIG. 3 illustrates a relationship between the In mole fraction of the well layers and the oscillation threshold current in a semiconductor laser diode, in which the length of the resonant cavity thereof is about 1 mm and the width of the ridge is about 5 μm. As can be seen from FIG. 3, where the In mole fraction of the well layers 151 is in the range from 0.05 to 0.1, the oscillation threshold current is smaller than 200 mA.

As described above, the creation of pits during the crystal growth can be suppressed in the multiple quantum well active layer 15 according to this embodiment. In addition, electrons and holes can be injected into the respective well layers 151 more uniformly and electrons can be injected more efficiently.

Firstly, since Al is contained in the barrier layers 152 in the multiple quantum well active layer 15, a tensile strain is induced in the barrier layers 152 in such a direction as reducing the compressive strain applied to the well layers 151. Accordingly, the critical thickness, at which the pits are created, can be increased. That is to say, so long as the total thickness of the multiple quantum well active layer 15 is within the increased critical thickness, the creation of pits can be suppressed effectively.

Secondly, the existence of Al with high electric field intensity in the crystals minimizes the diffusion of In, thus suppressing the segregation of In, which strongly tends to segregate locally. Moreover, the growth rate for the {1-101} planes is not so different from that for the (0001) plane in the AlGaN barrier layer 152 compared to the GaInN well layer 151. Accordingly, the expansion of pits can be reduced.

Figure 4:
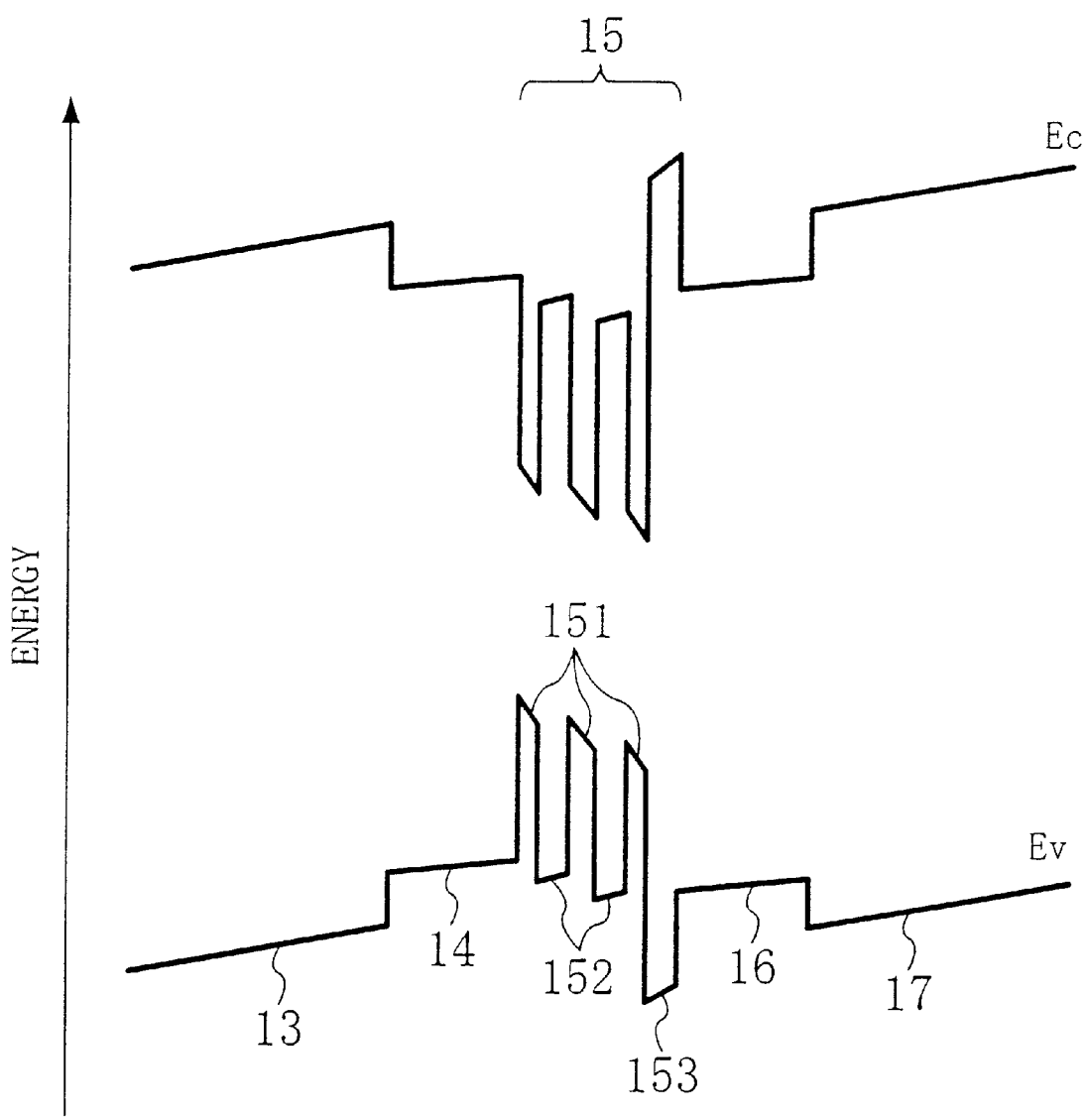
FIG. 4 is an energy band diagram illustrating the band gaps in the semiconductor light-emitting device according to the first embodiment of the present invention.
Figure 5:
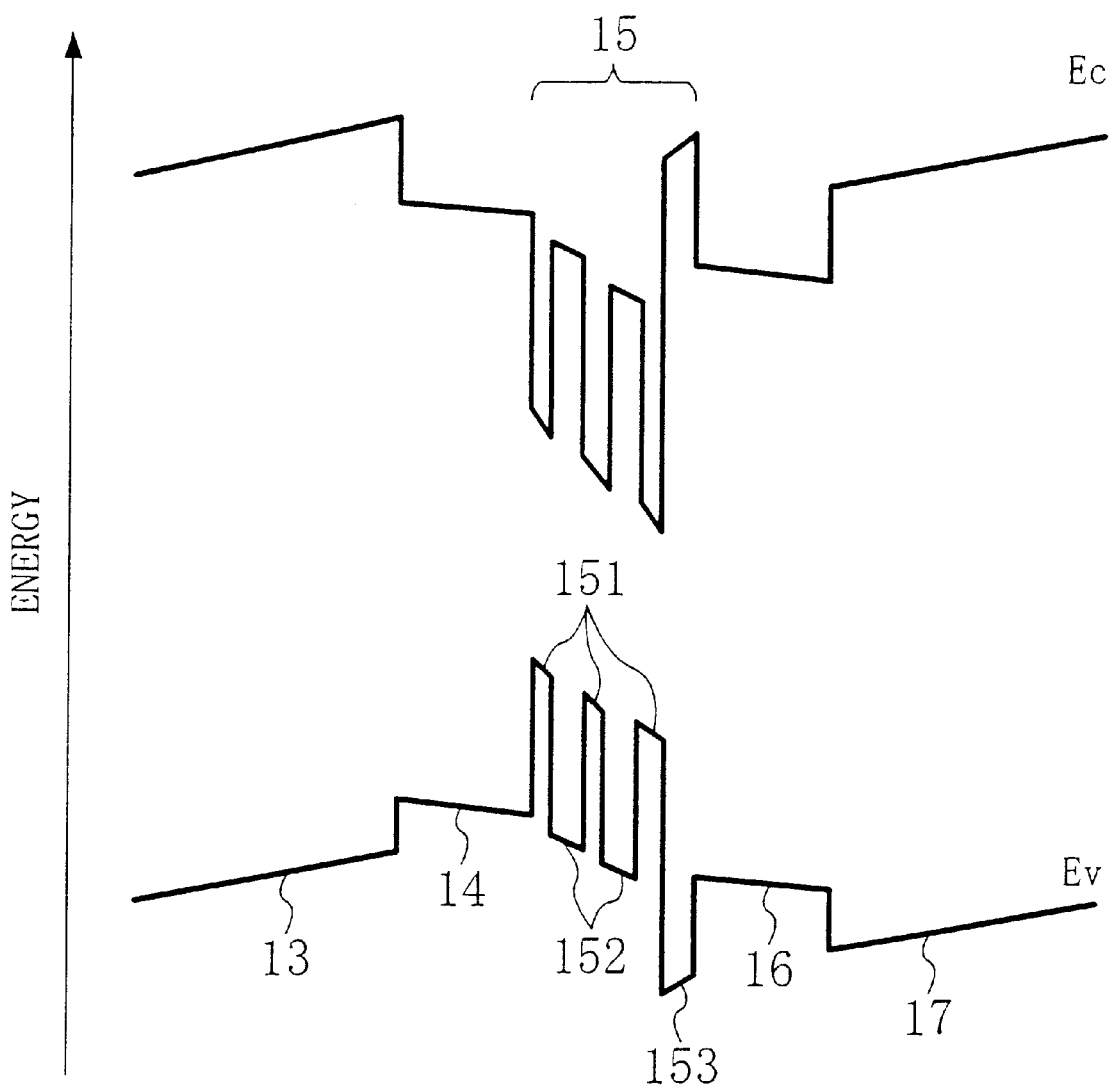
FIG. 5 is an energy band diagram illustrating the band gaps in a comparative semiconductor light-emitting device with a barrier layer containing no aluminum.

FIG. 4 is a band diagram illustrating the band gaps of the semiconductor light-emitting device according to this embodiment in view of the piezoelectric field. FIG. 5 is a band diagram illustrating the band gaps of a comparative semiconductor light-emitting device including GaInN barrier layers. In FIGS. 4 and 5, energy regions corresponding to the respective semiconductor layers shown in FIGS. 1 and 2 are identified by the same reference numerals. As can be seen, the piezoelectric field, which is strongly induced over the entire multiple quantum well active layer 15 in a direction heading toward the lower right in FIG. 5, has been weakened in FIG. 4 because an electric field has been induced in the Al-containing barrier layers 152 in the direction heading toward the upper right. Accordingly, electrons and holes can be injected into the respective well layers 151 more uniformly and the luminous efficacy improves as a result.

The Al mole fraction of the barrier layers 152 is larger than zero and equal to or smaller than that of the n- and p-type cladding layers 13 and 17 since a trade-off is necessary between suppression of pits and uniform injection of electrons and holes into the well layers. Preferably, the Al mole fraction of the barrier layers 152 is larger than zero and equal to or smaller than that of the n- and p-type optical guide layers 14 and 16. That is to say, the band gap of the barrier layers 152 is approximately equal to or smaller than that of the n- and p-type optical guide layers 14 and 16.

Also, since no In is contained in the barrier layers 152 of the multiple quantum well active layer 15, the compressive strain induced in the multiple quantum well active layer 15 can be reduced. In addition, In exists only in the well layers 151, and therefore, it is possible to prevent In from diffusing. That is to say, the expansion of a continuous In segregated region can be avoided.

Moreover, by setting the In mole fraction in the well layers 151 at 0.1 or less, it is possible to prevent the total thickness of the multiple quantum well active layer 15 from exceeding the critical thickness.

In this case, the critical thickness is not the only factor determining the thickness and number of the well layers 151. In view of luminous efficacy, the thickness of each of the well layers 151 is preferably in the range from about 2 to about 4 nm. Also, two, three or four well layers 151 are preferably formed to inject carriers uniformly and to attain a sufficient gain.

Furthermore, if the crystal being grown in the multiple quantum well active layer 15 are doped with Si as a dopant, the segregation of In can be suppressed and luminous efficacy improves. A specific mechanism thereof is not clear, but it is probably due to the surfactant effects attained by Si.

As described above, the barrier layers 152 in the multiple quantum well active layer 15, consisting of the well and barrier layers 151 and 152, is made of AlGaN crystals in the semiconductor light-emitting device according to this embodiment. In this structure, a tensile strain is induced in the barrier layers 152 and a compressive strain applied to the multiple quantum well active layer 15 can be reduced, thus increasing the critical thickness of crystals.

Also, by setting the In mole fraction in the well layers 151 composed of GaInN crystals at 0.1 or less, it is possible to prevent the total thickness of the multiple quantum well active layer 15 from exceeding the critical thickness, at which the pits are created. Accordingly, if the total thickness of the multiple quantum well active layer 15 is within the increased critical thickness, the creation of pits can be suppressed very effectively.

Hereinafter, a method for fabricating the semiconductor light-emitting device with the above structure will be described with reference to FIGS. 1 and 2. In the following description, a procedure of fabricating the semiconductor light-emitting device of this embodiment by an MOVPE process will be exemplified.

In the MOVPE process, alkyl metal compounds are used as source materials of Group III elements. Specifically, trimethylgallium (TMG) or triethylgallium (TEG) is used as a gallium source of the Group III elements. Trimethylaluminum (TMA) is used as an aluminum source. And trimethylindium (TMI) or ethyldimethylindium is used as an indium source.

Ammonium ($NH_3$) or hydrazine ($N_2H_4$) is used as source material of the Group V element (i.e., nitrogen). Silane ($SiH_4$) gas is used as a silicon source for supplying an n-type dopant. And bis-cyclopentadienyl magnesium ($Cp_2Mg$) is used as a magnesium source for supplying a p-type dopant.

First, the GaN substrate 11 with a (0001) plane as its principal surface is cleaned and then placed on a susceptor within a reaction chamber. Then, after the reaction chamber has been evacuated, the substrate 11 is heated at 1030° C. for 10 minutes within hydrogen and ammonium ambient at a pressure of about $800 \times 10^2$ Pa (=600 Torr), thereby cleaning the surface of the substrate 11.

Next, the temperature of the substrate is set to 1000° C. and then TMG and ammonium are supplied into the reaction chamber at a mole ratio of ammonium supplied as a Group V element to TMG supplied as a Group III element (hereinafter, simply referred to as "V/III mole ratio") of about 5000. At the same time, silane gas, which has been diluted with nitrogen as an Si dopant, is also supplied. In this manner, the n-type GaN buffer layer 12 with a carrier density of $8 \times 10^{17}/cm^{-3}$ is deposited to be about 2500 nm thick on the principal surface of the substrate 11 as shown in FIG. 1. In this process step, the growth rate is about 25 nm/min.

Next, TMA is newly supplied as an aluminum source onto the buffer layer 12, thereby growing the n-type $Al_{0.1}Ga_{0.9}N$ cladding layer 13 to a thickness of about 900 nm. Subsequently, the n-type $Al_{0.02}Ga_{0.98}N$ optical guide layer 14 is grown thereon to a thickness of about 100 nm. In this process step, since the solid phase ratio of Al is approximately equal to the vapor phase ratio thereof, the Al mole fraction in AlGaN is easily controllable.

Subsequently, as shown in FIG. 2, the substrate is cooled down to a temperature of about 800° C. Then, TEG, TMA and TMI are supplied as Group III sources, ammonium is supplied as a Group V source and nitride is supplied as a carrier gas. In this manner, the multiple quantum well active layer 15, which is a multilayer structure consisting of the $Ga_{0.92}In_{0.08}N$ well layers 151 (thickness: about 3 nm), $Al_{0.02}Ga_{0.98}N$ barrier layers 152 (thickness: about 5 nm) and an $Al_{0.15}Ga_{0.85}N$ protective layer 153, is grown on the n-type optical guide layer 14. In this case, the growth rate of each semiconductor layer is about 1 nm/min. The source materials for the respective semiconductor layers are supplied under the following conditions. In the well layers 151, the vapor phase ratio of TMI is 0.7 and the V/III ratio is 50,000. In the barrier layers 152, the vapor phase ratio of TMA is 0.02 and the V/III ratio is 200,000. In the protective layer 153, the vapor phase ratio of TMA is 0.15 and the V/III ratio is 190,000. It should be noted that the protective layer 153 is preferably grown at a relatively high temperature of about 900° C.

The fabrication process according to this embodiment is characterized by using TEG as a gallium source. Since the decomposition temperature of TEG is lower than that of TMG, the proportion of Ga atoms, to which no alkyl groups are bonded, is higher on the surfaces of crystals growing. In addition, the surface diffusion length of the Ga atoms, to which no alkyl groups are bonded, is longer than that of Ga molecules to which alkyl groups are bonded. Moreover, the Ga atoms, to which no alkyl groups are bonded, do not grow selectively so much on the surfaces of crystals. Considering these properties, if TEG is used as the gallium source, then the growth rate for the (0001) plane is not so different from that for the {1-101} planes, thus suppressing the expansion of pits.

Next, as shown in FIG. 1, the temperature of the substrate is raised again up to about 1000° C. Then, TMG and TMA as Group III sources and ammonium as a Group V source are supplied into the reaction chamber using hydrogen as a carrier gas and $Cp_2Mg$ is also supplied thereto as an Mg dopant. In this manner, the p-type AlGaN optical guide layer 16 with a thickness of about 100 nm is grown on the multiple quantum well active layer 15. Subsequently, the p-type AlGaN cladding layer 17 is deposited to be about 600 nm thick on the p-type optical guide layer 16. Thereafter, the supply of the source gases is suspended to lower the temperature of the substrate 11 to room temperature.

By processing a semiconductor wafer, or an epitaxial substrate, which is obtained through these crystal-growing process steps, in a predetermined manner, a singlemode laser device is obtained. Specifically, the epitaxially grown substrate is subjected to photolithography, dry etching, burying layer re-growth, electrode deposition, cleavage and mounting process steps in this order.

First, the photolithographic and dry etching process steps are performed to define a striped $SiO_2$ mask pattern with a width of about 3 μm on the p-type cladding layer 17. Next, using the mask pattern defined, the p-type cladding layer 17 is dry-etched to a depth of about 500 nm such that the p-type cladding layer 17 has ridge portions.

Then, the burying layer re-growth process step is performed. Specifically, the substrate 11 including the p-type cladding layer 17 with the ridge portions is loaded into the reaction chamber of the MOVPE apparatus again, thereby selectively growing the n-type GaN current blocking layer 18 so as to fill in the regions beside the ridge portions of the p-type cladding layer 17.

Thereafter, the substrate 11 is unloaded from the reaction chamber and the mask pattern is removed therefrom. Then, the substrate 11 is loaded into the reaction chamber again to grow the p-type GaN contact layer 19 with a carrier density of $8 \times 10^{17}/cm^{-3}$ to be about 300 nm thick on the current blocking layer 18, as well as over the ridge portions of the p-type cladding layer 17.

The acceptor Mg, or the p-type dopant introduced into the respective p-type semiconductor layers, may be activated either within the reaction chamber or within another heat treatment furnace after the substrate 11 has been unloaded from the reaction chamber. Also, the heat treatment may be conducted at the same time with a sintering process for electrode deposition. The heat treatment may be conducted at about 600° C. for about 20 minutes within nitrogen ambient.

Subsequently, in the electrode deposition process step, the p-side electrode 20 is selectively formed by an evaporation technique as a stack of two types of conductor films, e.g., nickel (Ni) and gold (Au) films, with thicknesses of 10 and about 300 nm, respectively, on part of the upper surface of the contact layer 19, which is located over the ridge portions of the p-type cladding layer 17.

Next, a mask pattern is defined over a region where the p-side electrode will be formed and the epitaxial layers are dry-etched using the mask pattern, thereby partially exposing the buffer layer 12. Then, the n-side electrode 21 is selectively formed as a stack of two types of conductor films, e.g., titanium (Ti) and Al films, on the exposed region by an evaporation technique.

Thereafter, the cleavage and mounting process steps are carried out. Specifically, first, the substrate 11 with the p- and n-side electrodes 20, 21 formed thereon is cleaved to have a resonant cavity length of about 500 μm. Then, the emissive and reflective end facets of the resonant cavity are coated appropriately. Finally, each of the laser devices cleaved is mounted facedown onto a heat sink such that the respective upper surfaces of the electrodes formed on the laser device face the mount surface of the heat sink.

As to the semiconductor light-emitting device obtained in this manner, we observed the surface morphology at the crystal planes of the as-formed multiple quantum well active layer 15 using a scanning electron microscope and an atomic force microscope. As a result, we confirmed that the density of pits in the multiple quantum well active layer 15 was lower than that of the pits observed in the conventional GaInN/GaInN multiple quantum well layer by a couple of orders of magnitudes.

As described above, in the fabrication process according to this embodiment, TEG is used as a gallium source when the multiple quantum well active layer 15 is formed. Thus, compared to using TMG, the growth rate for the (0001) plane is not so different from the growth rate for the {1-101} planes. As a result, it is possible to prevent the pits, which have been created on the faces of the crystal growing, from expanding.

In this embodiment, the well layers 151 are made of GaInN and the barrier layers 152 are made of AlGaN in the multiple quantum well active layer 15. Alternatively, the well and barrier layers 151 and 152 may be made of any other mixed crystals, e.g., AlGaInN. Even so, the creation of the pits can also be suppressed effectively.

Similar effects are attainable even by the use of a nitride semiconductor including boron (B) as an additional Group III element and arsenic (As) or phosphorus (P) as an additional Group V element, as well as nitrogen (N).

Also, in the foregoing embodiment, the pressure inside the reaction chamber is set at about $800 \times 10^2$ Pa, which is slightly lower than one atmospheric pressure (=$1013 \times 10^2$ Pa), in the MOVPE crystal-growing process. Alternatively, the reaction pressure may be set at any arbitrary value, because the present invention is not dependent on the reaction pressure.

Also, if the compositions and thicknesses of the well and barrier layers 151 and 152 in the multiple quantum well active layer 15 are appropriately selected, then the multiple quantum well active layer 15 as a whole can have no strain at all. This is because a compressive strain induced in the well layers 151 can be completely canceled by a tensile strain induced in the barrier layers 152.

Figure 6:
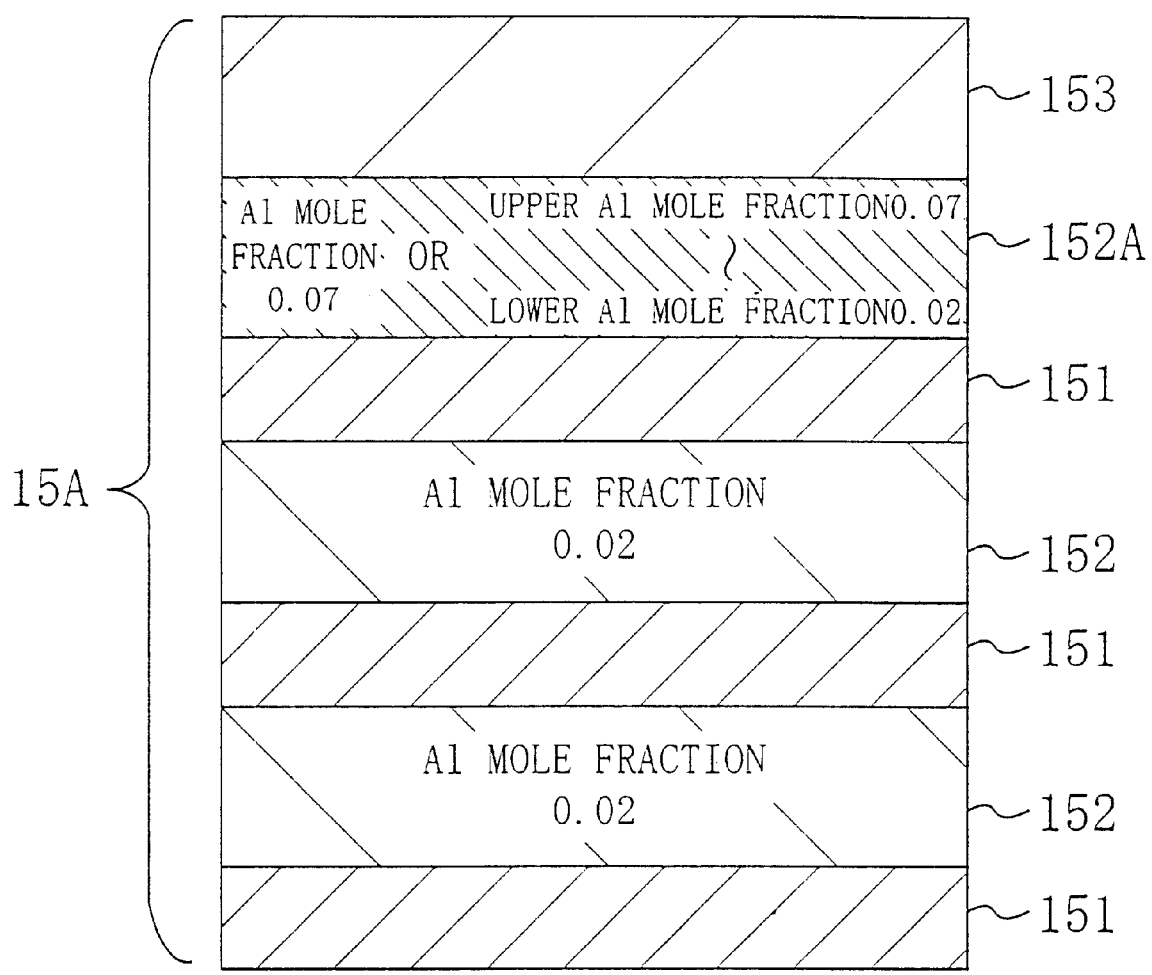
FIG. 6 is a cross-sectional view illustrating a detailed structure of a multiple quantum well active layer in the semiconductor light-emitting devices according to first and second modified examples of the first embodiment of the present invention.
Figure 7:
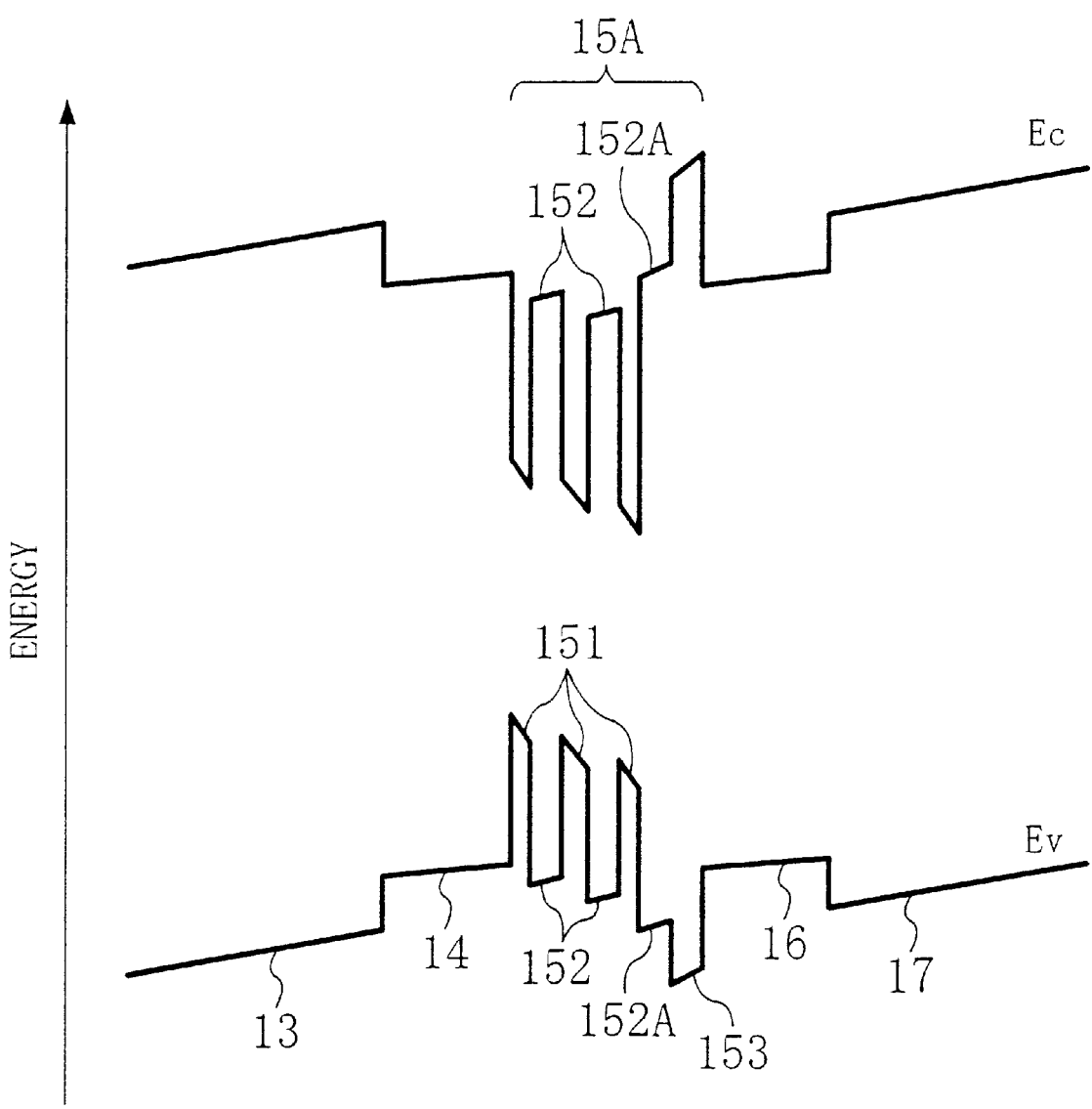
FIG. 7 is an energy band diagram illustrating the band gaps in the semiconductor light-emitting device according to the first modified example of the first embodiment of the present invention.

In a multiple quantum well active layer 15 shown in FIG. 6 as a first modified example of this embodiment, the Al mole fraction of first and second barrier layers 152 may be set to 0.02, for example, and a third barrier layer 152A with an Al mole fraction of 0.07, for example, may be provided between the protective layer 153, which is a p-type conductive layer, and the third well layer 151. In such a case, the energy Ec of the third barrier layer 152A at the lower edge of the conduction band is higher than that of the second barrier layer 152 as shown in the band diagram in FIG. 7. The heterobarrier formed by the third barrier layer 152A prevents electrons externally injected from going over the well layer 151 and overflowing into the p-type conductive layer. As a result, the electrons can be injected into the well layers 151 more efficiently.

Figure 8:
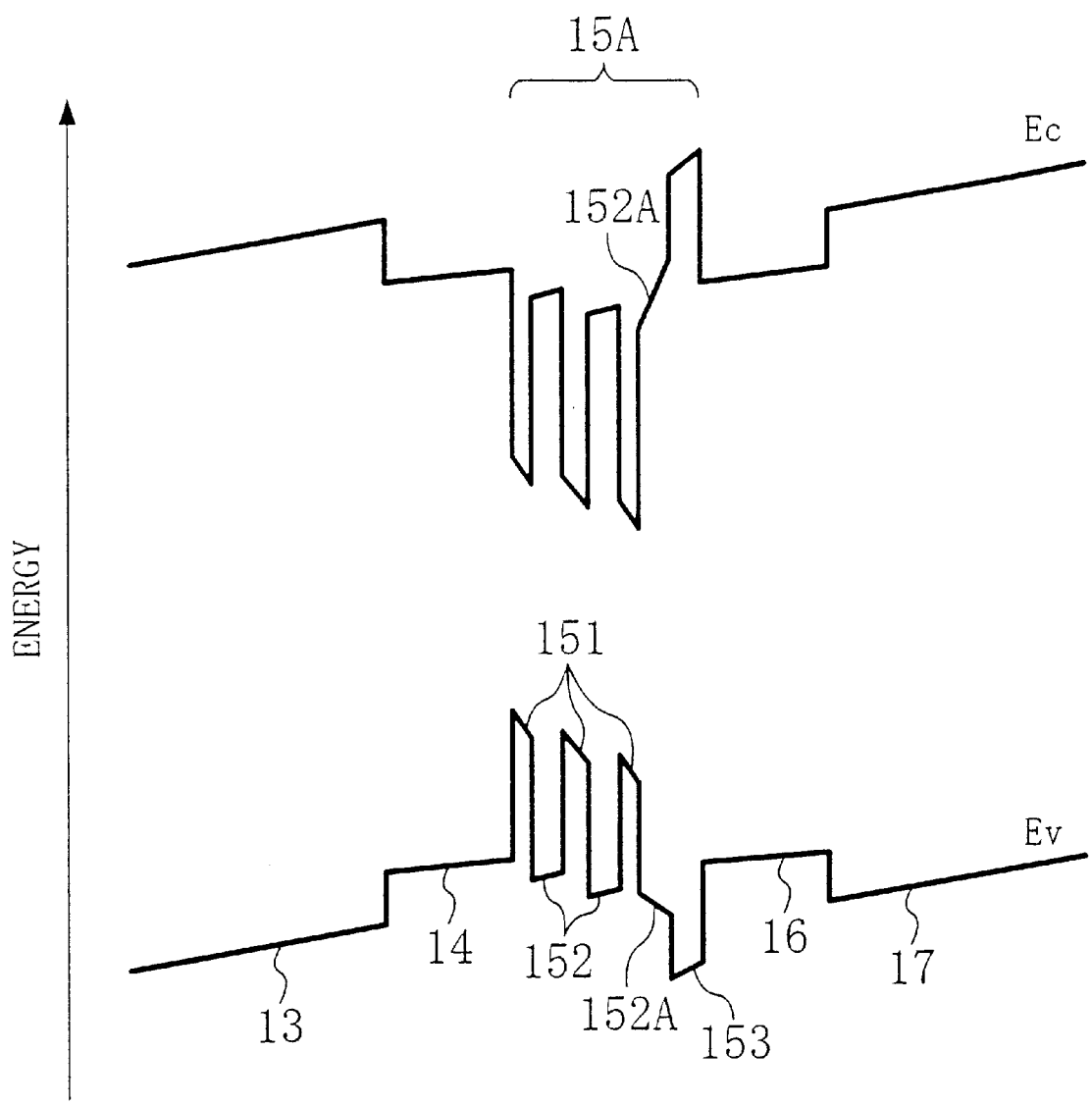
FIG. 8 is an energy band diagram illustrating the band gaps in the semiconductor light-emitting device according to the second modified example of the first embodiment of the present invention.

Moreover, according to a second modified example, the Al mole fraction of the third barrier layer 152 may be gradually increased from 0.02 in a part thereof closer to the well layer 151 toward 0.07 in another part thereof closer to the p-type protective layer as shown in FIG. 6. In such a case, the electrons can also be injected into the well layers 151 more efficiently. In addition, the energy Ev of the third barrier layer 152A at the upper edge of the valence band is relatively low in a part thereof closer to the protective layer 153 and relatively high in another part thereof closer to the well layer 151 as shown in the band diagram in FIG. 8. Thus, the probability of holes in the third barrier layer 152 can be reduced, and therefore, holes can be injected into the well layer 151 more efficiently.

As described above, according to this embodiment, the creation of pits in the multiple quantum well active layer 15 can be suppressed and electrons and holes can be injected into the multiple quantum well active layer 15 more efficiently. Accordingly, a semiconductor laser device, which oscillates at a lower threshold value and is highly reliable in term of its lifetime, can be obtained and is applicable as a light-emitting device to an optical disk apparatus.

Also, the present invention is applicable not only to a semiconductor light-emitting device but also to a high-mobility electronic device such as a heterojunction field effect transistor with a similar heterojunction to that of the inventive structure. Even then, the creation of pits in the heterojunction is also suppressible, thus increasing the mobility of electrons.

Embodiment 2

Hereinafter, a second embodiment of the present invention will be described with reference to the accompanying drawings.

Figure 9:
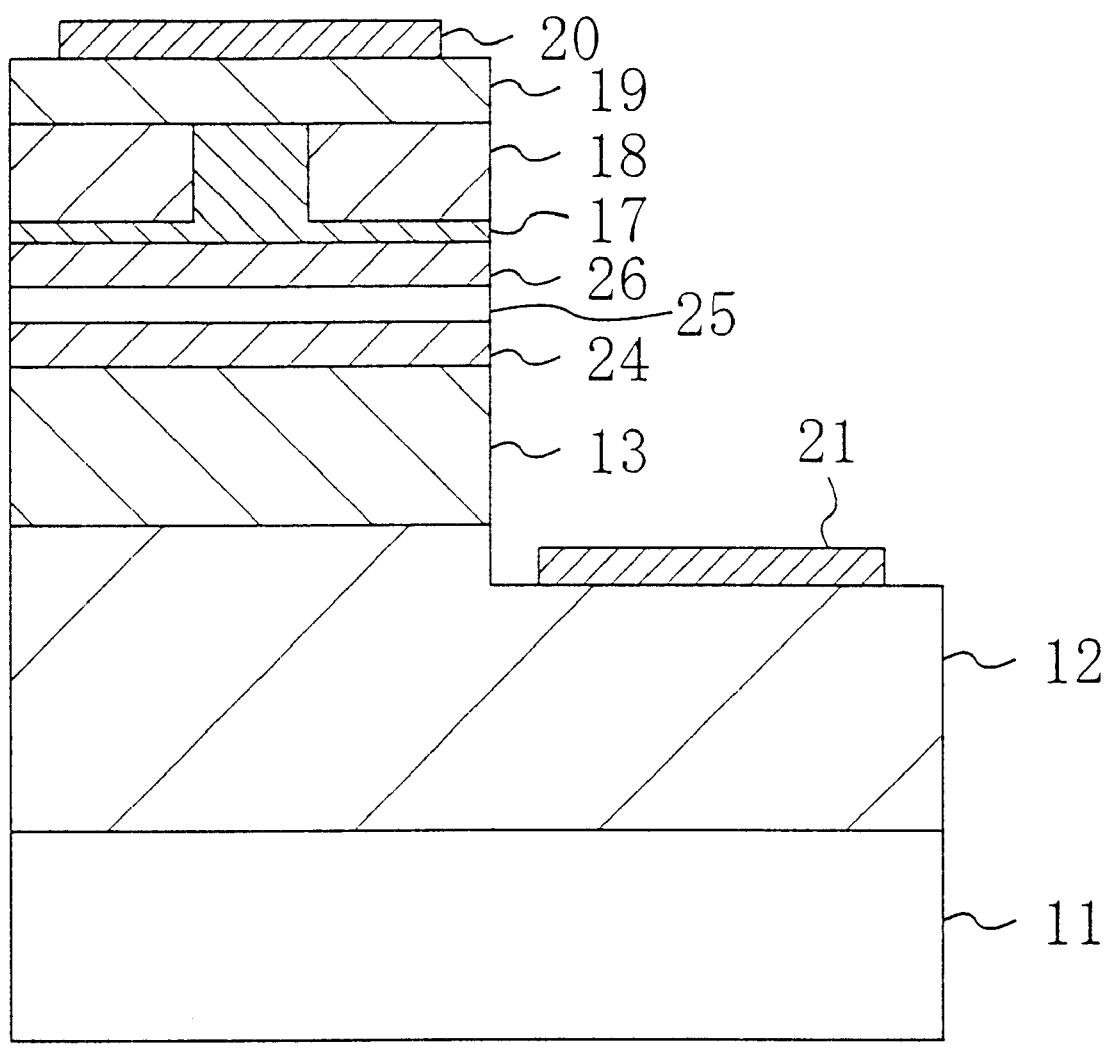
FIG. 9 is a cross-sectional view illustrating a schematic structure of a semiconductor light-emitting device according to a second embodiment of the present invention.

FIG. 9 illustrates a schematic cross-sectional structure of a semiconductor light-emitting device according to the second embodiment of the present invention. In FIG. 9, the same members as those illustrated in FIG. 1 are identified by the same reference numerals, and the description thereof will be omitted herein. In the semiconductor light-emitting device according to this embodiment shown in FIG. 9, an n-type optical guide layer 24 formed on the n-type cladding layer 13 is made of n-type GaN. A multiple quantum well active layer 25 located on the n-type optical guide layer 24 is formed by alternately stacking GaInN well layers and GaN or AlGaN barrier layers one upon the other. And a p-type optical guide layer 26 located on the multiple quantum well active layer 25 is made of p-type GaN.

Figure 10:
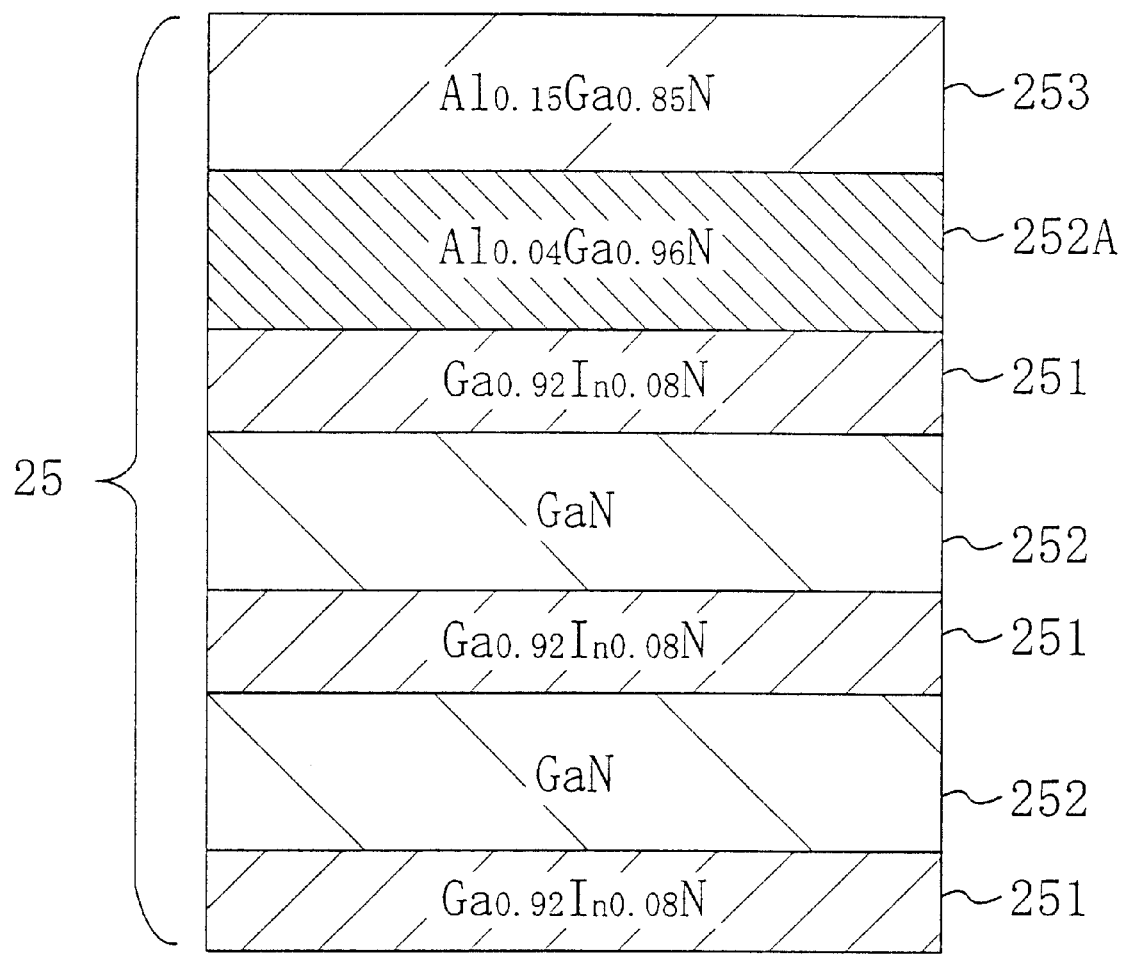
FIG. 10 is a cross-sectional view illustrating a detailed structure of the multiple quantum well active layer in the semiconductor light-emitting device according to the second embodiment of the present invention.

FIG. 10 illustrates a detailed cross-sectional structure of the multiple quantum well active layer 25 according to this embodiment. As shown in FIG. 10, three GaInN well layers 251, each of which is about 3 nm thick and has an In mole fraction of 0.08; first, second and third barrier layers 252, 252 and 252A, each of which alternates with the well layers 251 and is about 5 nm thick; and one protective layer 253, which is formed on the upper surface of the third barrier layer 252A, is about 5 nm thick and has an Al mole fraction of 0.15 are stacked in this order on the substrate.

In this case, the first and second barrier layers 252 are made of GaN, for example, and the third barrier layer 252A is made of AlGaN with an Al mole fraction of 0.04, for example.

Figure 11:
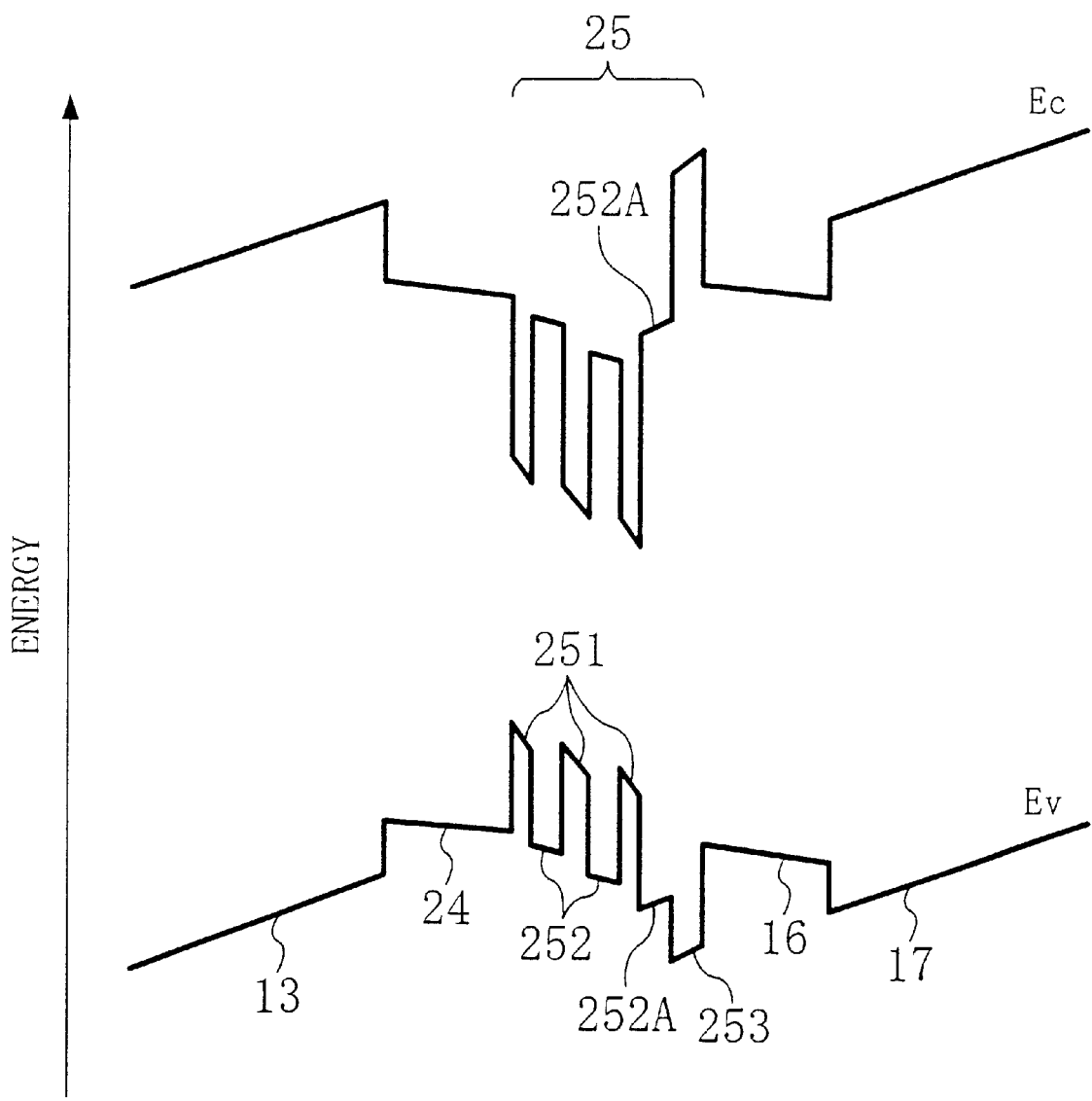
FIG. 11 is an energy band diagram illustrating the band gaps in the semiconductor light-emitting device according to the second embodiment of the present invention.

The third barrier layer 252A with an Al mole fraction smaller than that of the protective layer 253 is provided between the protective layer 253 and the third well layer 251. Thus, as shown in the band diagram in FIG. 11, a heterobarrier higher than those of the first and second barrier layers 252 is formed by that Al contained in the third barrier layer 252A. Accordingly, it is possible to prevent the externally injected electrons from going over the well layer 251 and overflowing. In addition, piezoelectric field is also induced in such a direction as suppressing the overflow of electrons, thus injecting the electrons into the well layers 251 more efficiently.

According to a modified example, the Al mole fraction of the third barrier layer 252A may be gradually increased from 0 in a part thereof closer to the well layer 251 toward 0.04 in another part thereof closer to the protective layer 253. In such a case, the electrons can also be injected into the well layers 251 more efficiently. In addition, the probability of holes in the third barrier layer 252A can be reduced, and therefore, holes can be injected into the well layers 251 more efficiently.

Embodiment 3

Hereinafter, a third embodiment of the present invention will be described with reference to the accompanying drawings.

Figure 12:
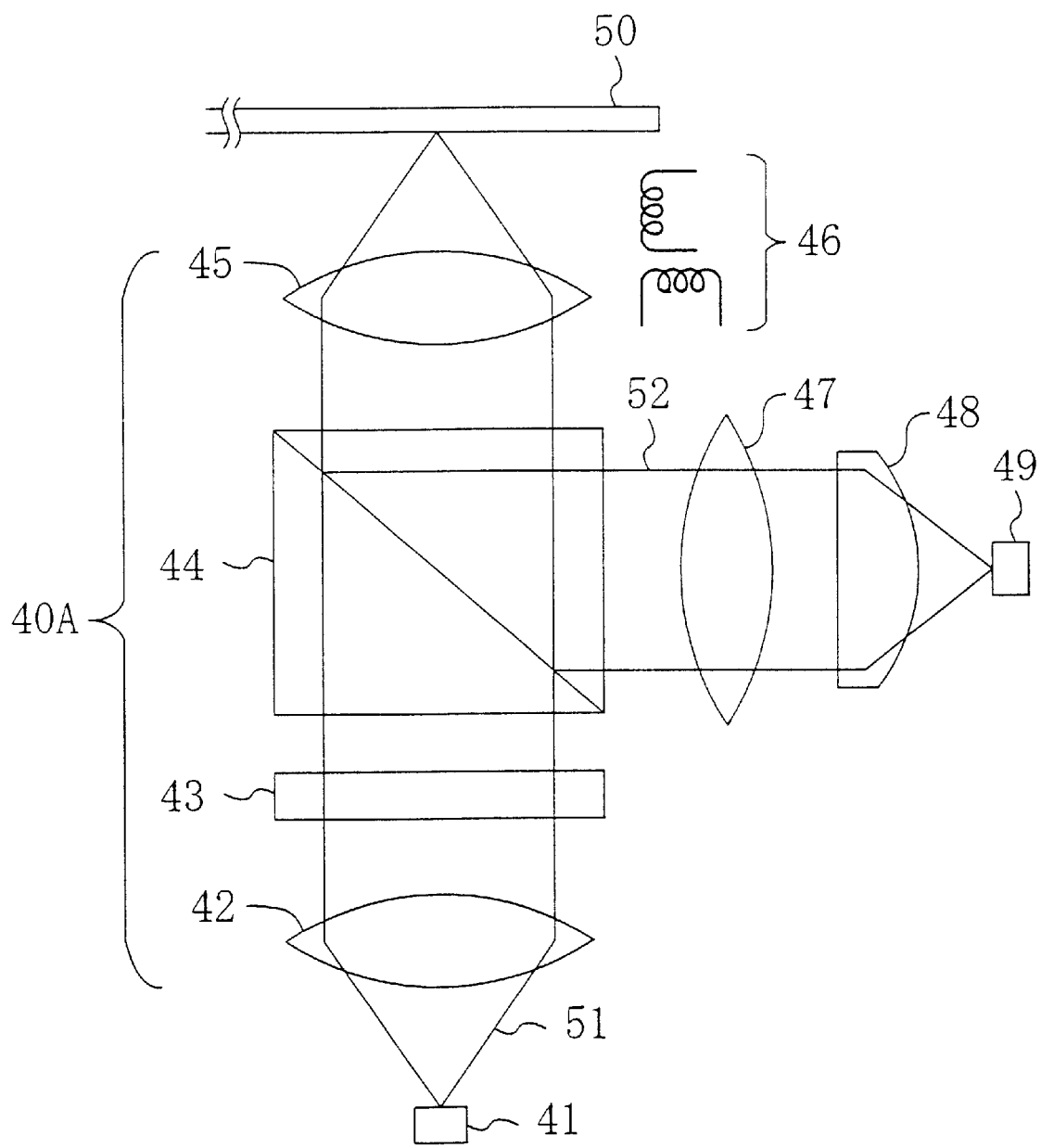
FIG. 12 illustrates a schematic arrangement of an optical disk apparatus according to a third embodiment of the present invention.

FIG. 12 schematically illustrates an arrangement of an optical disk apparatus according to the third embodiment of the present invention. The optical disk apparatus according to this embodiment uses the inventive semiconductor light-emitting device as a light source section thereof. As shown in FIG. 12, the semiconductor laser device 41, which includes a laser chip packaged in a can, is disposed at such a position that the emissive end facet thereof faces the data-retaining side of an optical disk 50, i.e., a storage medium on which desired data has been recorded. And a condensing optical system 40A is provided between the semiconductor laser device 41 and the optical disk 50 in this optical disk apparatus.

The condensing optical system 40A includes: a collimator lens 42 for collimating outgoing radiation 51, which has been emitted from the semiconductor laser device 41, into parallel light; a diffraction grating 43 for splitting the parallel light into three beams (not shown); a half prism 44 for transmitting the outgoing radiation 51 and changing the optical path of light 52 that has been reflected from the optical disk 50; and a condenser lens 45 for condensing these three beams onto the optical disk 50. These members are placed in this order such that the collimator lens 42 is closest to the semiconductor laser device 41. In the illustrated embodiment, laser radiation with a wavelength of about 405 nm is used as the outgoing radiation 51.

Each of the three beams is condensed on the optical disk 50 as a spot with a diameter of about 0.8 μm. A drive circuit 46 is further provided to correct a radial displacement of the optical disk 50, which is detected based on the locations of these three spots, by moving the condenser lens 45 appropriately.

On the optical path of the reflected light 52 outgoing from the half prism 44, provided are a receiving lens 47 for converging the reflected light 52, a cylindrical lens 48 for detecting a focus error, and a photodiode 49 for converting the condensed reflected light 52 into electrical signals.

As described above, the optical disk apparatus includes: the condensing optical system 40A for guiding the outgoing radiation 51 emitted from the semiconductor laser device 41 onto the optical disk 50; and the photodiode 49 receiving the light 52 that has been reflected from the optical disk 50. If the inventive semiconductor light-emitting device that can emit blue laser radiation stably just as designed is applied to this optical disk apparatus, then data that has been recorded on the optical disk 50 at a high density can be read out (reproduced).

The laser chip preferably exhibits self-oscillating properties to read out information more accurately. This is because even if the optical output power of the laser chip is relatively low, the laser chip is less susceptible to the effects of returning radiation in such a situation and the SNR improves as a result. When the laser chip is provided with such self-oscillating properties, there is no need to additionally provide any radio frequency circuit to minimize the effects of that light returning to the semiconductor laser device 41, thus simplifying the device construction advantageously and making it easier to downsize the device.

Furthermore, the optical disk apparatus according to this embodiment can also operate to output laser radiation at a power of as high as about 25 mW. Thus, the optical disk apparatus can also write, or record, data onto the optical disk 50. That is to say, the optical disk apparatus can perform both recording and reproducing operations alike using a single semiconductor laser device 41 and the performance thereof is excellent in spite of its simplified configuration.

Embodiment 4

Hereinafter, a fourth embodiment of the present invention will be described with reference to the accompanying drawings.

Figure 13:
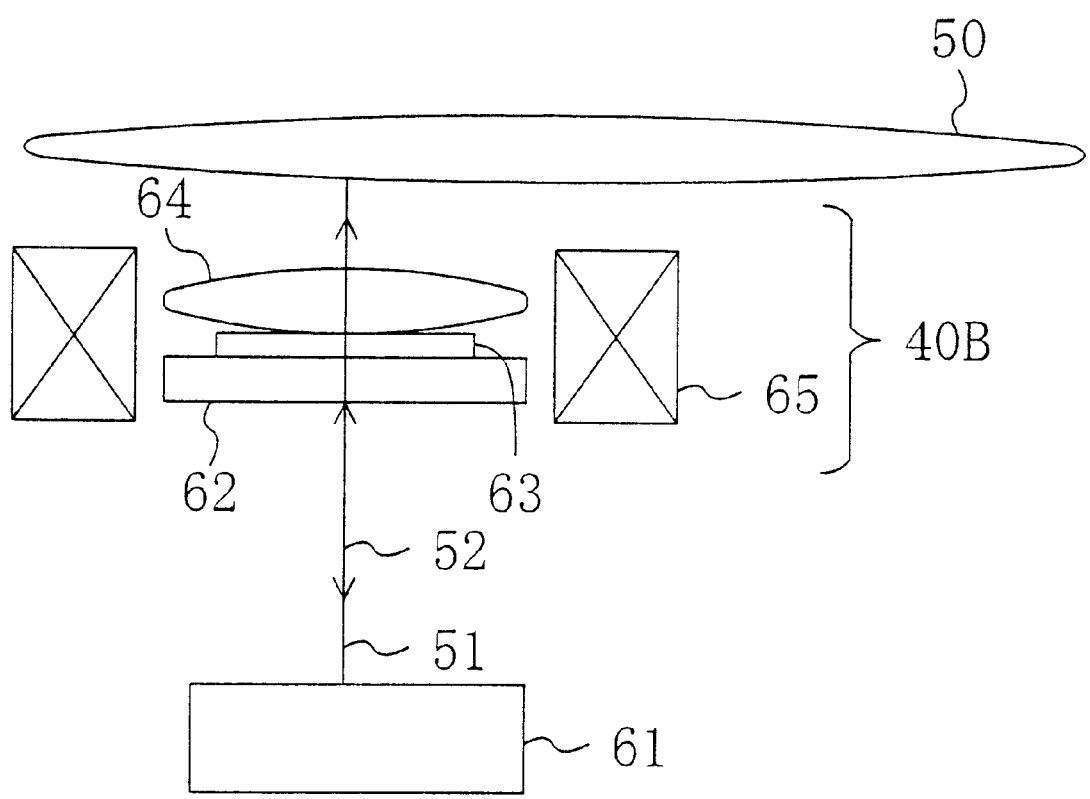
FIG. 13 illustrates a schematic arrangement of an optical disk apparatus according to a fourth embodiment of the present invention.

FIG. 13 schematically illustrates an arrangement of an optical disk apparatus according to the fourth embodiment of the present invention. The optical disk apparatus according to this embodiment uses the inventive semiconductor light-emitting device as a light source section thereof. Also, the optical disk apparatus can be of smaller size and thickness by providing a laser chip, a photodiode for detecting an optical signal and a micro mirror for changing the optical path of laser radiation emitted from the laser chip on a single support member or substrate of silicon (Si). In the following description, the laser chip, photodiode and micro mirror will be collectively referred to as a "laser unit".

As shown in FIG. 13, the laser unit 61 is disposed at such a position that the emissive end facet thereof faces the data-retaining side of an optical disk 50, i.e., a storage medium on which desired data has been recorded. And a condensing optical system 40B is provided between the laser unit 61 and the optical disk 50 in this optical disk apparatus.

The condensing optical system 40B includes a hologram 62 including: a grating pattern on a first incidence plane thereof to split the outgoing radiation 51 incident on the first plane into three beams; and a holographic pattern on a second incidence plane, on which the light 52 that has been reflected from the optical disk 50 is incident, such that the light 52 is diffracted, condensed and diffused as ±first-order light in the direction parallel to the surface of the disk 50. The system 40B further includes: a quarter-wave plate 63 for converting linearly polarized light into circularly polarized light, or vice versa; and an objective lens 64 for condensing the outgoing radiation 51 onto a desired information track on the optical disk 50. These members are provided in this order such that the hologram 62 is the closest to the laser unit 61. An actuator 65 is further provided beside the condensing optical system 40B to correct the deviation between the outgoing radiation 51 and the reflected light 52.

Figure 14:
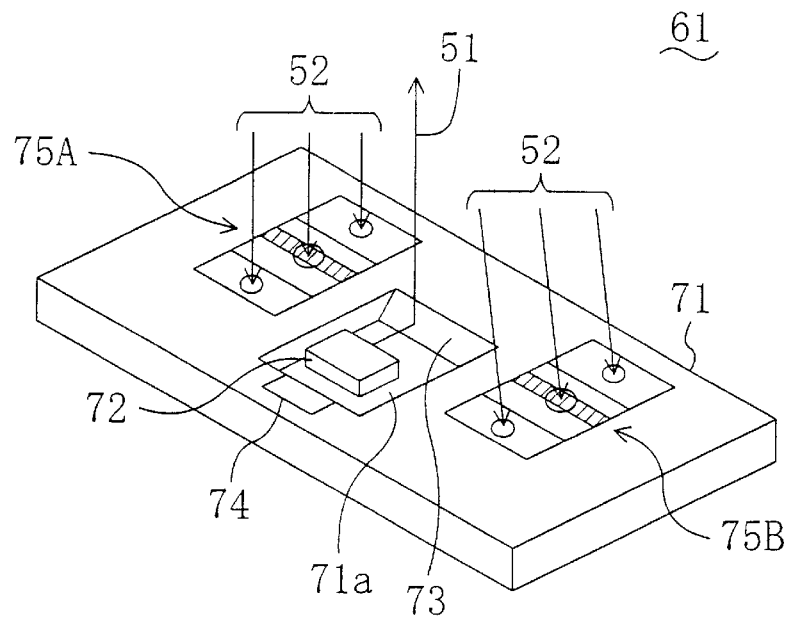
FIG. 14 is a perspective view illustrating a laser unit in the optical disk apparatus according to the fourth embodiment of the present invention.

FIG. 14 illustrates a configuration for the laser unit 61 according to this embodiment. As shown in FIG. 14, the laser unit 61 is formed on a single substrate 71 of Si. A concave portion 71a is provided in the principal surface of the substrate 71, and the inventive semiconductor laser chip 72 is bonded onto the bottom of the concave portion 71a with solder, for example. A micro mirror 73 is provided on a side-wall of the concave portion 71a so as to face the emissive end facet of the laser chip 72 and to form an angle of 45 degrees with the principal surface of the substrate 71. In this arrangement, the outgoing radiation 51 emitted from the laser chip 72 is reflected from the micro mirror 73 to advance substantially vertically to the principal surface of the substrate 71. In this case, the micro mirror 73 is preferably a (111) plane of Si. The Si (111) plane can be optically planarized easily because the (111) plane can be formed with ease by anisotropic etching and is chemically stable. An angle of 54 degrees sharp is formed between the (111) plane and a (100) plane. Thus, if a substrate with its principal plane inclined from a (100) plane toward the [110] direction by 9 degrees is used as the substrate 71, then the sidewall forming the angle of 45 degrees with the principal plane of the substrate 71 can be obtained as intended.

An output-monitoring photodiode 74 for monitoring the output power of the laser chip 72 based on the laser radiation emitted in a small quantity from the reflective end facet of the laser chip 72 is formed on another sidewall of the concave portion 71a of the substrate 71 so as to form an angle of 63 degrees with the principal surface of the substrate 71 and to face the micro mirror 73. The surface of the micro mirror 73 may be either bare silicon or be coated with a metal thin film of Au, Ag or Al, which reflects the laser radiation at a high reflectance and absorbs the radiation at a low absorbance, to improve the luminous efficacy of the laser radiation.

First and second photodiodes 75A and 75B are provided as photodetectors for receiving the reflected light 52 in the upper part of the substrate 71, which is a bulk of a semiconductor, so as to be parallel to the reflective plane of the micro mirror 73 and to interpose the micro mirror 73 therebetween. Each of these photodiodes 75A and 75B is divided into five portions extending in the direction parallel to the reflective plane of the micro mirror 73.

Figure 15:
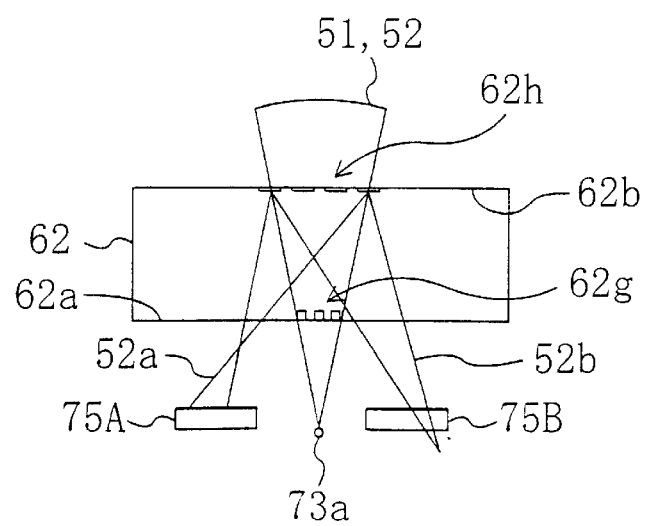
FIG. 15 is a cross-sectional view illustrating a schematic arrangement of a hologram in the optical disk apparatus according to the fourth embodiment of the present invention.

FIG. 15 illustrates a cross-sectional structure and the action of the hologram 62. As described above, a grating pattern 62g is formed on the first incidence plane 62a, on which the outgoing radiation 51 that has been substantially emitted from a position 73a on the micro mirror 73 is incident. And a holographic pattern 62h is formed on the second incidence plane 62b, which faces the first incidence plane 62a and receives the reflected light 52. First diffracted light 52a of the reflected light 52 that has been incident on the hologram 62 and then diffracted toward the first photodiode 75A is a beam focused in front of the light-receiving plane of the first photodiode 75A. On the other hand, second diffracted light 52b that has been diffracted toward the second photodiode 75B is a beam focused behind the light-receiving plane of the second photodiode 75B.

Figure 16A:
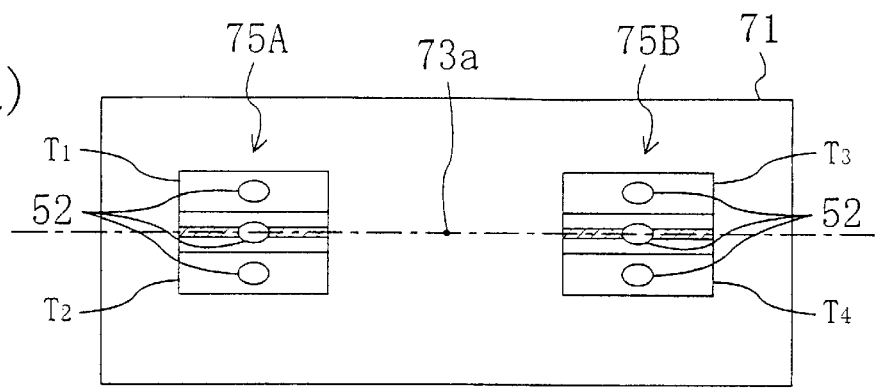
FIG. 16(a) is a plan view schematically illustrating a laser unit in the optical disk apparatus according to the fourth embodiment of the present invention.

FIG. 16(a) schematically illustrates a planar layout of the laser unit according to this embodiment. In FIG. 16(a), the same components as those illustrated in FIG. 14 are identified by the same reference numerals. As shown in FIG. 16(a), the light-receiving area of each of the photodiodes 75A and 75B is divided into five areas. One of the three reflected (or diffracted) beams 52 is incident on the inner three areas of the five. And the other two reflected (or diffracted) beams 52 are incident on the remaining two outer areas.

Hereinafter, respective methods for detecting tracking error signal, focus error signal and information signal recorded on the optical disk will be outlined.

The tracking error signal TES is given by the following Equation (1):

$$TES=(T1-T2)+(T3-T4) \qquad (1)$$

where T1 and T2 represent the signal intensities of the beams incident on the two outer areas of the first photodiode 75A and T3 and T4 represent the signal intensities of the beams incident on the two outer areas of the second photodiode 75B, respectively, as shown in FIG. 16(a).

Figure 16B:
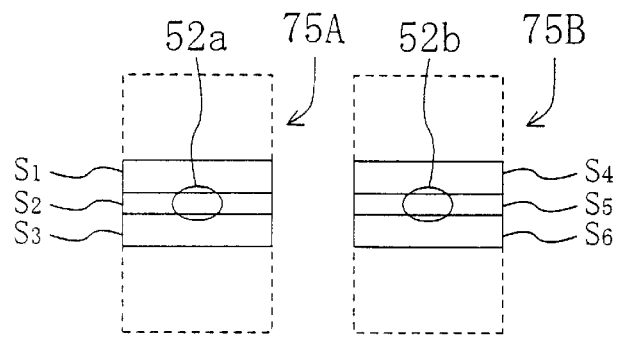
FIGS. 16(b) through 16(d) are plan views schematically illustrating how photodiodes of the laser unit in the optical disk apparatus according to the fourth embodiment of the present invention receive light to be converted into signals.

The focus error signal FES is given by the following Equation (2):

$$FES=(S1+S3+S5)-(S2+S4+S6) \qquad (2)$$

where S1, S2 and S3 represent the signal intensities of the beam incident on the three inner areas of the first photodiode 75A and S4, S5 and S6 represent the signal intensities of the beam incident on the three inner areas of the second photodiode 75B, respectively, as shown in FIG. 16(b).

The actuator 65 shown in FIG. 13 is driven such that the result of Equation (2) becomes zero, thereby making the objective lens 64 follow up the information tracks on the optical disk 50.

Figure 16C:
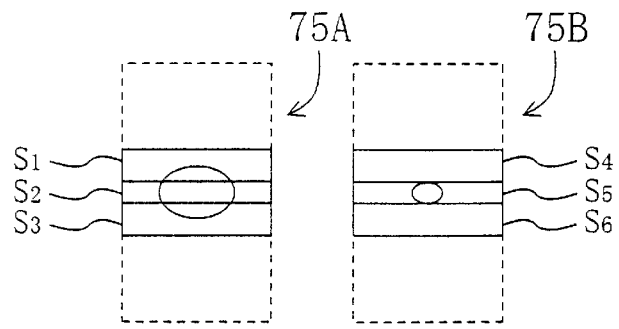
Figure 16D:
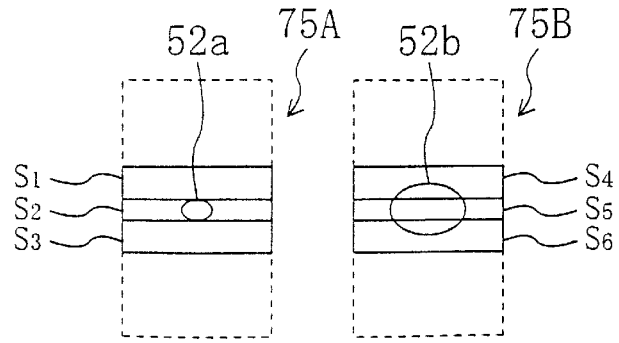

In the illustrated embodiment, FIG. 16(b) shows a situation where FES=0, thus indicating that no focus error is caused. In contrast, FES is not equal to zero in either situation shown in FIG. 16(c) or 16(d), thus indicating that a focus error has been caused.

The information signal RFS is also given in the same way by the following Equation (3):

$$RFS=(S1+S3+S5)-(S2+S4+S6) \qquad (3)$$

According to this embodiment, the optical disk apparatus can be downsized and thinned by using the laser unit 61 shown in FIG. 14. Also, in fabricating the optical disk apparatus according to this embodiment, the assembly process is completed by simply performing the steps of: preparing the Si substrate 71 with the photodiodes 75A and 75B and the concave portion 71a formed in the principal surface thereof and with the micro mirror 73 formed on a sidewall of the concave portion 71a; and bonding the laser chip 72 onto the bottom of the concave portion 71a of the substrate 71. Accordingly, its fabricating process is also simplified and yet the production yield can be increased.

What is claimed is:

1. A semiconductor light-emitting device of Group III-V compound semiconductors, the device comprising:
    a quantum well layer, which is formed over a substrate and includes a barrier layer and a well layer that are alternately stacked one upon the other, a band gap of the well layer being narrower than a band gap of the barrier layer,
    wherein the well layer contains indium and nitrogen, while the barrier layer contains aluminum and nitrogen,
    wherein a plurality of the barrier layers are provided between p- and n-type conductive layers, and
    wherein one of the barrier layers that is in contact with the p-type conductive layer has an aluminum mole fraction larger than that of the other barrier layer(s) that is/are not in contact with the p-type contact layer and the aluminum mole fraction of the one barrier layer increases from a part thereof closest to the n-type conductive layer toward another part thereof closest to the p-type conductive layer.

2. A semiconductor light-emitting device of Group III-V compound semiconductors, the device comprising:
    a quantum well layer, which is formed over a substrate and includes a barrier layer and a well layer that are alternately stacked one upon the other, the band gap of the well layer being narrower than that of the barrier layer,
    first and second optical guide layers, the first optical guide layer being provided on one side of the quantum well layer that is closer to the substrate, the second optical guide layer being provided on another side of the quantum well layer that is opposite to the substrate,
    wherein the band gap of the barrier layer is smaller than or equal to that of the first and second optical guide layers, and
    wherein the well layer contains indium and nitrogen, while the barrier layer contains aluminum and nitrogen.

3. The semiconductor light-emitting device of claim 2, wherein the first or second optical guide layer contains aluminum and nitrogen.

4. A semiconductor light-emitting device of Group III-V compound semiconductors, the device comprising:
    a quantum well layer, which is formed over a substrate and includes a barrier layer and a well layer that are alternately stacked one upon the other, the band gap of the well layer being narrower than that of the barrier layer,
    first and second optical guide layers, the first optical guide layer being provided on one side of the quantum well layer that is closer to the substrate, the second optical guide layer being provided on another side of the quantum well layer that is opposite to the substrate,
    wherein the barrier layer has a strain vector of a sign opposite to that of a strain vector of the well layer,
    wherein the well layer contains indium and the barrier layer contains aluminum, and
    wherein the band gap of the barrier layer is smaller than or equal to that of the first and second optical guide layers.

5. The semiconductor light-emitting device of claim 4, wherein the first or second optical guide layer contains aluminum.

* * * * *